(12) United States Patent
Kim et al.

(10) Patent No.: US 10,950,427 B2
(45) Date of Patent: Mar. 16, 2021

(54) QUANTUM DOTS AND PRODUCTION METHOD THEREOF

(71) Applicants: SAMSUNG ELECTRONICS CO., LTD., Suwon-si (KR); THE TRUSTEES OF THE UNIVERSITY OF PENNSYLVANIA, Philadelphia, PA (US)

(72) Inventors: Tae Gon Kim, Hwaseong-si (KR); Nuri Oh, Philadelphia, PA (US); Tianshuo Zhao, Philadelphia, PA (US); Cherie Kagan, Philadelphia, PA (US); Eun Joo Jang, Suwon-si (KR); Christopher Murray, Philadelphia, PA (US)

(73) Assignees: SAMSUNG ELECTRONICS CO., LTD., Gyeonggi-do (KR); THE TRUSTEES OF THE UNIVERSITY OF PENNSYLVANIA, Philadelphia, PA (US)

( * ) Notice: Subject to any disclaimer, the term of this patent is extended or adjusted under 35 U.S.C. 154(b) by 0 days.

(21) Appl. No.: 16/441,574

(22) Filed: Jun. 14, 2019

(65) Prior Publication Data

US 2019/0385839 A1    Dec. 19, 2019

Related U.S. Application Data

(60) Provisional application No. 62/684,912, filed on Jun. 14, 2018, provisional application No. 62/687,765, filed on Jun. 20, 2018.

(51) Int. Cl.
*H01L 29/06* (2006.01)
*H01L 21/02* (2006.01)
(Continued)

(52) U.S. Cl.
CPC ...... *H01L 21/02205* (2013.01); *H01L 29/127* (2013.01); *H01L 29/66439* (2013.01); *H01L 29/66977* (2013.01); *H01L 29/775* (2013.01)

(58) Field of Classification Search
None
See application file for complete search history.

(56) References Cited

U.S. PATENT DOCUMENTS 8,546,853 B2    10/2013  Tian et al.
9,315,896 B2*   4/2016   Pore ................. H01L 21/02546
(Continued)

FOREIGN PATENT DOCUMENTS

KR    20100035466 A    4/2010
KR    20140117204 A    10/2014
KR    20170007641 A    1/2017

OTHER PUBLICATIONS

Christopher M. Evans et al., "Synthesis and Use of Tris(trimethylsilyl)antimony for the Preparation of InSb Quantum Dots," Chemistry of Materials, Sep. 23, 2008, pp. 5727-5730, vol. 20, No. 18.
(Continued)

*Primary Examiner* — Hung K Vu

(74) *Attorney, Agent, or Firm* — Cantor Colburn LLP

(57) ABSTRACT

A production method of a quantum dot comprising a Group IIIA-VA compound, the quantum dot as prepared, and an electronic device including the same, and the production method includes:
supplying a Group VA element precursor including a halide of a Group VA element and a first ligand of a phosphine compound or a first amine compound; and performing a reaction between the Group VA element precursor and a Group IIIA metal precursor in the
(Continued)

presence of a reducing agent in an organic reaction medium including a second amine compound.

18 Claims, 19 Drawing Sheets

(51) Int. Cl.
   *H01L 29/12* (2006.01)
   *H01L 29/66* (2006.01)
   *H01L 29/775* (2006.01)

(56) References Cited

U.S. PATENT DOCUMENTS

| | | |
|---|---|---|
| 9,343,301 B2 | 5/2016 | Harris et al. |
| 9,517,936 B2 | 12/2016 | Jeong et al. |
| 9,790,425 B2 | 10/2017 | McDaniel |
| 2012/0052006 A1* | 3/2012 | Boyes .................. A61K 9/5138 424/1.29 |
| 2014/0155640 A1 | 6/2014 | Pickett et al. |
| 2017/0218264 A1 | 8/2017 | Klimov et al. |
| 2018/0375046 A1* | 12/2018 | Lee ..................... C09K 11/565 |

OTHER PUBLICATIONS

Maksym Yarema et al., "Colloidal Synthesis of InSb Nanocrystals with Controlled Polymorphism Using Indium and Antimony Amides," Chemistry of Materials, Apr. 3, 2013, pp. 1788-1792, vol. 25.

Soong Ju Oh et al., "Designing High-Performance PbS and PbSe Nanocrystal Electronic Devices through Stepwise, Post-Synthesis, Colloidal Atomic Layer Deposition," Nano Letters, Feb. 6, 2014, pp. 1559-1566, vol. 14.

Wenyong Liu et al., "Colloidal InSb Nanocrystals," Journal of the American Chemical Society, Dec. 2, 2012, pp. 20258-20261, vol. 134.

* cited by examiner

FIG. 1D

| Conductor electrode (e.g., Au) |
| Carrier auxiliary layer (e.g., metal oxide such as $MoO_3$) |
| Quantum dot layer (e.g., InSb, $InAs_xSb_{1-x}$) |
| Carrier auxiliary layer (e.g., metal oxide such as ZnO) |
| Transparent conductor (ITO)/Glass |

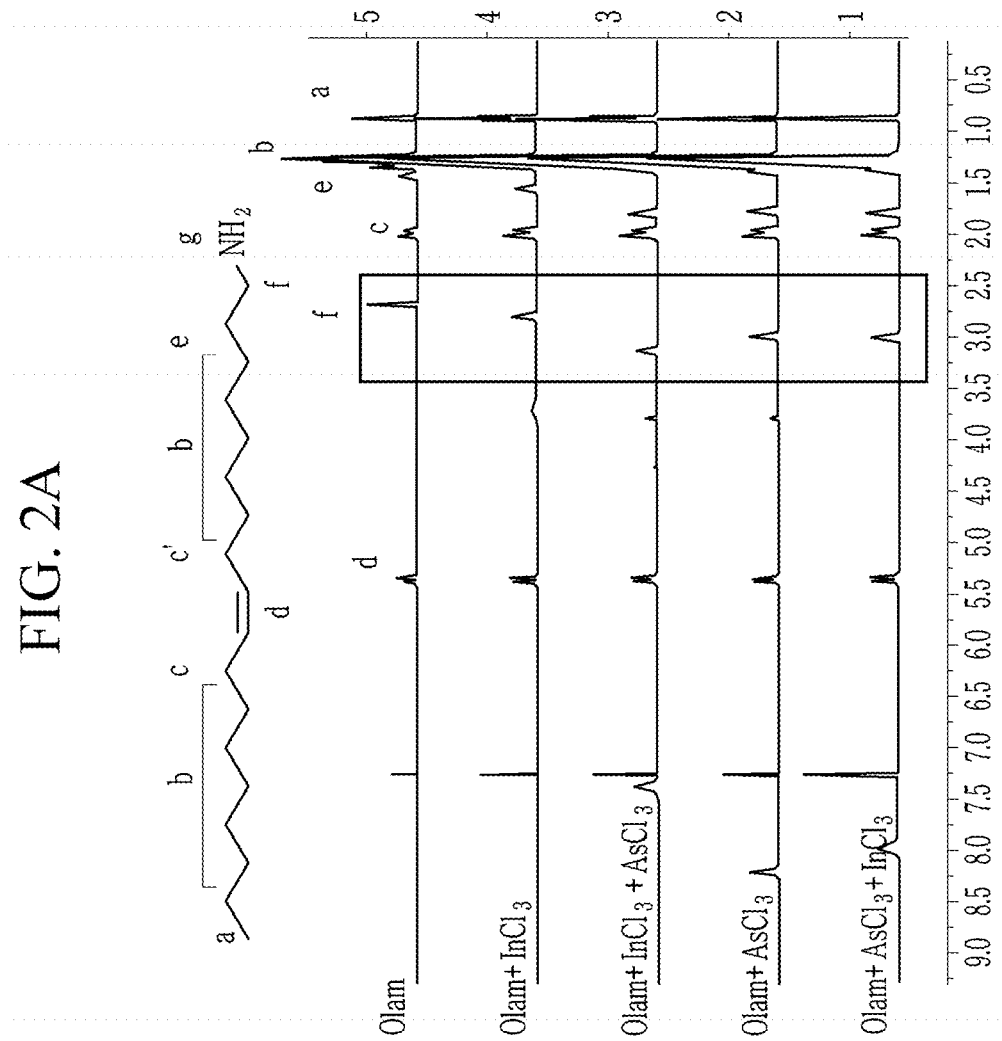

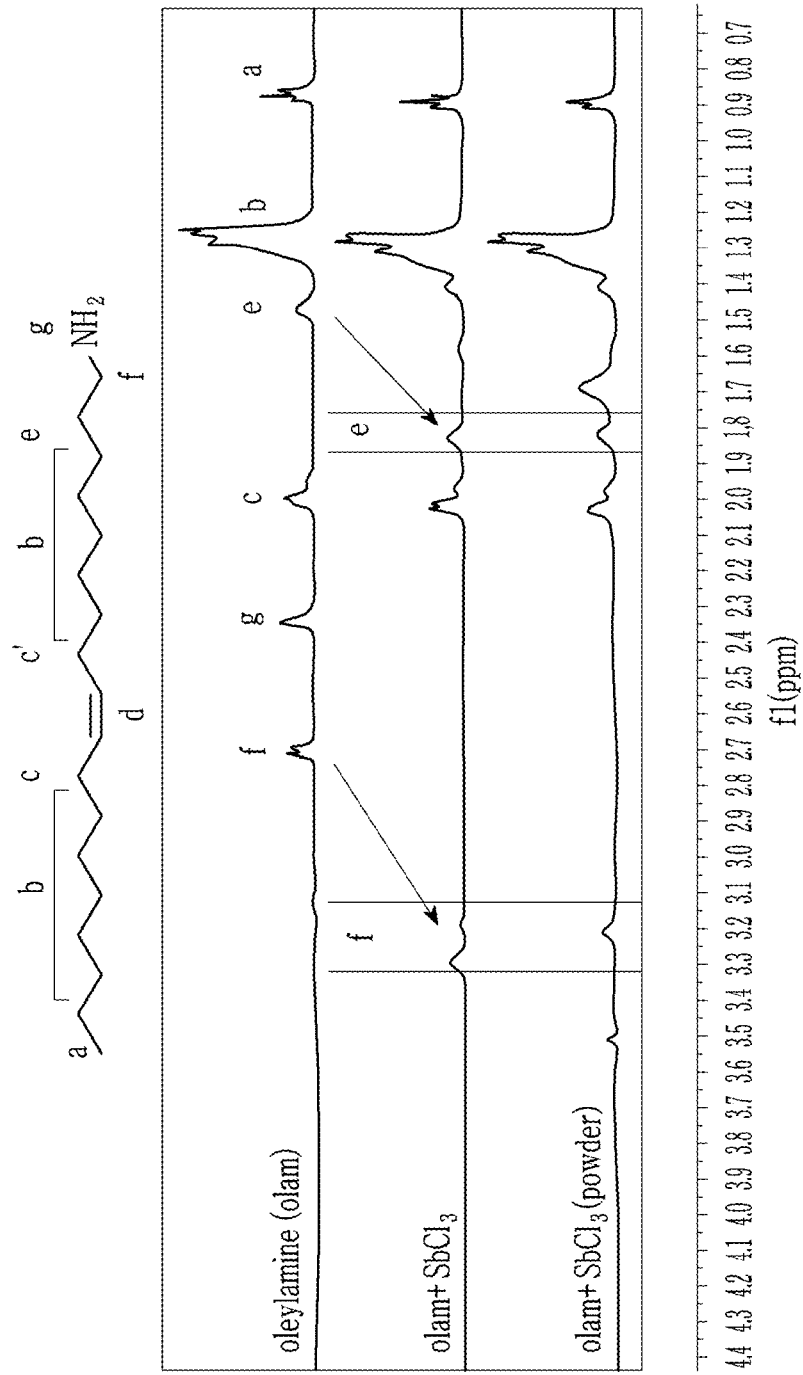

QUANTUM DOTS AND PRODUCTION METHOD THEREOF

CROSS-REFERENCE TO RELATED APPLICATION

This application claims priority to and the benefit of U.S. Provisional Patent Applications Nos. 62/684,912 filed on Jun. 14, 2018, and 62/687,765 filed on Jun. 20, 2018, the contents of which in their entirety are herein incorporated by reference.

BACKGROUND

1. Field

A quantum dot and a production method thereof are disclosed.

2. Description of the Related Art

Unlike bulk materials, physical characteristics (e.g., energy bandgap and melting point) of nanocrystal particles that are intrinsic may be controlled by changing the sizes of the nanocrystal particles. For example, a semiconductor nanocrystal (also known as a quantum dot) is a semiconductor material having a crystalline structure of a size of several nanometers. The semiconductor nanocrystal has a relatively small size and a relatively large surface area per unit volume and the semiconductor nanocrystal may exhibit a quantum confinement effect. Therefore, the semiconductor nanocrystal has different physicochemical characteristics than the bulk material having the same composition. For example, the energy bandgap of a quantum dot may be controlled by changing the size and composition of the quantum dot and thereby the quantum dot may emit light of high color purity with different wavelengths. Therefore, quantum dots may be used in various fields such as display, energy, electronic, and/or biological technologies.

Quantum dots based on cadmium, lead, or mercury may exhibit enhanced optical properties, but quantum dots based on cadmium, lead, or mercury include toxic heavy metal that may pose a serious threat to the environment. Thus, it may be desired to develop a quantum dot that may exhibit enhanced luminous properties without including a toxic heavy metal.

SUMMARY

An embodiment provides a Group IIIA-VA compound based (e.g., an indium based) quantum dot exhibiting enhanced light emitting properties and not including a toxic heavy metal.

An embodiment provides a process of preparing the indium-based quantum dot.

An embodiment provides a film including the indium-based quantum dot and an electronic device including the same.

An embodiment is related to a production method of a quantum dot including a Group IIIA-VA compound, which includes supplying a Group VA element precursor including a halide of a Group VA element and a first ligand including a phosphine compound or a first amine compound; and performing a reaction between the Group VA element precursor and a Group IIIA metal precursor in the presence of a reducing agent in an organic reaction medium including a second amine compound.

The quantum dot may not include cadmium, lead, mercury, or a combination thereof.

The quantum dot may not include cadmium, lead, and mercury.

The Group VA element may include phosphorous, antimony, arsenic, bismuth, or a combination thereof. The Group VA element may not include nitrogen.

The halide of the Group VA element may include a chloride, a bromide, an iodide, or a combination thereof.

The halide of the Group VA element may include $PCl_3$, $SbCl_3$, $AsCl_3$, $BiCl_3$, $PBr_3$, $SbBr_3$, $AsBr_3$, $BiBr_3$, $PI_3$, $SbI_3$, $AsI_3$, $BiI_3$, or a combination thereof.

The phosphine compound may include a (e.g., at least one, two or three) C1 to C40 aliphatic hydrocarbon, a (e.g., at least one, two or three) C6 to C40 aromatic hydrocarbon, or a combination thereof, which is (are) linked to a phosphorous atom.

The phosphine compound may include $R_3PO$, $R_2HPO$, $RH_2PO$, $R_3P$, $R_2PH$, $RPH_2$, $RPO(OH)_2$, $RHPOOH$, $RHPOOH$, $R_2POOH$, or a combination thereof, wherein each R is independently a substituted or unsubstituted C5 to C40 aliphatic hydrocarbon, a substituted or unsubstituted C6 to C40 aromatic hydrocarbon, or a combination thereof.

The phosphine compound may include a trialkylphosphine, a diaryl phosphine, or a combination thereof.

The phosphine compound may include trioctylphosphine, diphenylphosphine, or a combination thereof.

The amine compound may include a C1 to C40 aliphatic hydrocarbon, a C6 to C40 aromatic hydrocarbon, or a combination thereof.

The amine compound (e.g., the first amine compound) may include $RNH_2$, $R_2NH$, or a combination thereof, wherein each R is independently a substituted or unsubstituted C5 to C40 aliphatic hydrocarbon, a substituted or unsubstituted C6 to C40 aromatic hydrocarbon, or a combination thereof.

The amine compound may include an amine including a C6 to C40 alkenyl group, an amine including a C6 to C40 alkyl group, or a combination thereof.

The amine compound may not include a tertiary amine.

The method may further include preparing the Group VA element precursor by dissolving the halide of the Group VA element in the first ligand optionally at a temperature of greater than or equal to about 30° C. (or at least about 80° C.) to prepare a (e.g., transparent) solution.

The method may further include preparing the Group VA element precursor by adding a non-solvent to the prepared solution to precipitate a solid including the Group VA element precursor.

The Group VA element precursor may have a form of a (e.g., transparent) liquid at a temperature of greater than or equal to about 60° C.

The Group VA element precursor may be a solid at room temperature.

The Group IIIA metal precursor may include indium, gallium, or a combination thereof.

The Group IIIA metal precursor may include an amine group, a halide moiety, or a combination thereof.

The Group IIIA metal precursor may include indium chloride, indium iodide, indium bromide, gallium chloride, gallium iodide, gallium bromide, aluminum chloride, aluminum iodide, aluminum bromide, or a combination thereof.

The reducing agent may include a hydride reducing agent.

The hydride reducing agent may include lithium aluminum hydride; trialkoxyaluminum hydride, aluminum hydride, sodium borohydride, lithium borohydride, borane, sodium cyanoborohydride, lithium trialkylborohydride, or a combination thereof.

The second amine compound may include a C1 to C40 aliphatic hydrocarbon, a C6 to C40 aromatic hydrocarbon, or a combination thereof.

The second amine compound may include oleyl amine, octyl amine, dioctyl amine, or a combination thereof. The second amine compound may not be a tertiary amine compound.

The first amine compound and the second amine compound may be the same.

The reaction may be carried out at a temperature of greater than or equal to about 200° C., for example, greater than or equal to about 210° C., greater than or equal to about 220° C., greater than or equal to about 230° C., greater than or equal to about 240° C., greater than or equal to about 250° C., greater than or equal to about 260° C., greater than or equal to about 270° C., or greater than or equal to about 275° C., greater than or equal to about 280° C., greater than or equal to about 285° C., greater than or equal to about 290° C., greater than or equal to about 295° C., greater than or equal to about 300° C., greater than or equal to about 305° C., greater than or equal to about 310° C., greater than or equal to about 315° C., greater than or equal to about 320° C., greater than or equal to about 325° C., greater than or equal to about 330° C., greater than or equal to about 335° C., or greater than or equal to about 340° C.

The performing the reaction may include heating the organic reaction medium including the reducing agent, the Group IIIA metal precursor, and the Group VA element precursor at a predetermined rate.

The reaction may be performed in the absence of a phosphine compound.

The method may include dissolving the IIIA metal precursor in the second amine compound to obtain a solution and degassing the solution at a temperature of at least about 100° C. prior to conducting the reaction.

The method may not include a size selection process and the quantum dots prepared therefrom may have a particle size distribution (e.g., a standard deviation) of less than or equal to about 15% (e.g., less than or equal to about 14%, less than or equal to about 13%, less than or equal to about 12%, or less than or equal to about 11%) of an average particle size.

In an embodiment, a plurality of quantum dots include a Group IIIA-VA compound and do not include cadmium, lead, or mercury, wherein the Group IIIA-VA compound includes a Group IIIA metal including indium and optionally gallium, aluminum, or a combination thereof; and a Group VA element, the Group VA element including phosphorus, antimony, arsenic, bismuth, or a combination thereof, the plurality of quantum dots exhibit a zinc blende crystal structure in an X-ray diffraction spectroscopy analysis; and a molar ratio of the Group VA element with respect to the Group IIIA metal is less than or equal to about 1.3:1 as determined by an inductively coupled plasma spectroscopic analysis.

The quantum dots may be prepared in the aforementioned method.

The quantum dots may not include cadmium, lead, mercury, or a combination thereof.

The quantum dots may not include cadmium, lead, and mercury.

In the quantum dots, the Group VA element may further include phosphorous.

A particle size distribution of the plurality of the quantum dots may be less than or equal to about 10% of an average particle size.

A particle size distribution of the plurality of the quantum dots may be less than or equal to about 9% of an average particle size.

A particle size distribution of the plurality of the quantum dots may be greater than or equal to about 5% of an average particle size.

A particle size distribution of the plurality of the quantum dots may be greater than or equal to about 6% of an average particle size.

A molar ratio of the Group VA element with respect to the Group IIIA metal may be greater than or equal to about 0.6:1.

A molar ratio of the Group VA element with respect to the Group IIIA metal may be greater than or equal to about 0.8:1.

A molar ratio of the Group VA element with respect to the Group IIIA metal may be greater than or equal to about 1:1.

A molar ratio of the Group VA element with respect to the Group IIIA metal may be greater than or equal to about 1.15:1 (e.g., measured by ICP-OES).

A molar ratio of the Group VA element with respect to the Group IIIA metal may be greater than or equal to about 1.2:1 (e.g., measured by ICP-OES).

A molar ratio of the Group VA element with respect to the Group IIIA metal may be less than about 1.29:1. (e.g., measured by ICP-OES).

A molar ratio of the Group VA element with respect to the Group IIIA metal may be less than about 1.26:1. (e.g., measured by ICP-OES).

A molar ratio of the Group VA element with respect to the Group IIIA metal may be less than about 1.2:1.

A molar ratio of the Group VA element with respect to the Group IIIA metal may be less than about 1.13:1.

A molar ratio of the Group VA element with respect to the Group IIIA metal may be less than or equal to about 1.1:1.

The quantum dots may have an average size of greater than or equal to about 3 nanometers (nm).

The quantum dots may have an average size of greater than or equal to about 6 nm.

The quantum dots may have an average size of less than or equal to about 15 nm.

The quantum dots may have an average size of less than or equal to about 12 nm.

In a transmission electron microscopic analysis, the quantum dot as prepared may exhibit formation of a super-lattice structure.

The quantum dots may include InSb, $InAs_xSb_{1-x}$, $In_xGa_{1-x}Sb$, $In_xGa_{1-x}As_ySb_{1-y}$, or a combination thereof wherein x is greater than 0 and less than 1 and y is greater than 0 and less than 1.

In the quantum dots, the Group VA element may include at least two of antimony (Sb), arsenic (As), and bismuth.

The Group VA element may include antimony (Sb) and arsenic (As).

In the quantum dots, a molar ratio of the antimony with respect to the arsenic may be greater than or equal to about 0.1:1 and less than or equal to about 9:1, for example, as determined by an energy dispersive spectroscopic analysis.

In the quantum dots, a molar ratio of the antimony with respect to the arsenic may be greater than or equal to about 0.13:1 and less than or equal to about 7.5:1.

The quantum dots may have a peak, e.g., the (111) diffraction peak in a range of greater than 23 degrees and less than 25 degrees in 2 theta of an X-ray diffraction spectrum.

In an absorption spectrum, the quantum dots may have an absorption peak in a range of greater than or equal to about 900 nm (or greater than or equal to about 1,000 nm) and less than or equal to about 1,600 nm (or less than or equal to about 1,560 nm, less than or equal to about 1,550 nm, or less than or equal to about 1,500 nm).

In a photoluminescence spectrum, the quantum dots may have a photoluminescent peak in a range of greater than or equal to about 1,000 nm (or greater than or equal to about 1,100 nm) and less than or equal to about 1,700 nm (less than or equal to about 1,650 nm, less than or equal to about 1,600 nm, or less than or equal to about 1,500 nm or less than or equal to about 1,450 nm).

An embodiment is related to a device including the aforementioned quantum dots, wherein the device includes a first electrode and a second electrode spaced apart from each other and a semiconductor layer including a plurality of the aforementioned quantum dots.

Major surfaces of the first electrode and the second electrode may face with each other.

The semiconductor layer may be interposed between the first electrode and the second electrode.

The semiconductor layer may include an alkylammonium halide, a carboxylic acid compound including a thiol group, a thiocyanate (SCN) compound, alkali metal sulfide ($Na_2S$), $NOBF_4$, an alkali azide or a combination thereof.

The semiconductor layer may include alkali metal sulfide ($Na_2S$) and an alkali azide.

The alkylammonium halide may include tetrabutylammonium iodide.

The carboxylic acid compound may include mercapto propionic acid.

The thiocyanate (SCN) compound may include $NH_4SCN$.

The alkali azide compound may include sodium azide.

The device may include a carrier auxiliary layer (e.g., an electron transport layer, a hole transport layer, or a carrier (electron, hole, or a combination thereof) blocking layer) between the semiconductor layer and the first electrode, between the semiconductor layer and the second electrode, or both.

The carrier auxiliary layer may include a metal oxide.

The metal oxide may include a molybdenum oxide, a zinc oxide, or a combination thereof.

The device may further include a third electrode facing (or opposite to) the semiconductor layer and an insulation layer interposed between the semiconductor layer and the third electrode.

The electronic device may be configured to have a field effect hole mobility of greater than or equal to about $10^{-5}$ square centimeters per volt-second ($cm^2/Vs$).

The electronic device may be configured to have a field effect hole mobility of greater than or equal to about $10^{-4}$ $cm^2/Vs$.

The aforementioned production method may provide quantum dots that do not include a toxic heavy metal element such as cadmium, lead, or mercury while having uniform size distribution without conducting a size selection process of the quantum dots.

The quantum dots thus prepared may exhibit improved stability, improved optical properties (e.g., enhanced light absorption at a relatively long wavelength region of for example about 1.55 micrometers (μm)), and enhanced electrical properties.

The quantum dots thus prepared may be used in a semiconductor layer of a device such as a photodiode, a photodetector, a field effect transistor, or the like.

BRIEF DESCRIPTION OF THE DRAWINGS

FIG. 1D is a schematic cross-sectional view of a device of an embodiment.

FIG. 2A is a nuclear magnetic resonance (NMR) spectrum of oleyl amine (Olam), a mixture of the oleyl amine and $InCl_3$, a mixture of the oleyl amine, $InCl_3$, and $AsCl_3$, a mixture of the oleyl amine and $AsCl_3$, and a mixture of the oleyl amine, $AsCl_3$, and $InCl_3$.

FIG. 2B is an NMR spectrum of the halide of the Group VA element, the first ligand, and the Group VA element precursor that are used in Example 1.

DETAILED DESCRIPTION

Figure 1A:
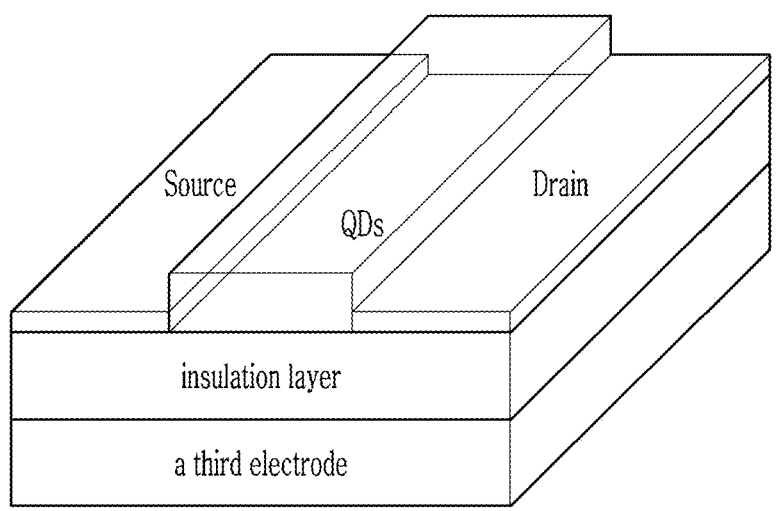
FIG. 1A is a schematic view of a device of an embodiment.

This disclosure will be described more fully hereinafter in the following detailed description, in which some but not all embodiments of this disclosure are described. This disclosure may be embodied in many different forms and is not be construed as limited to the embodiments set forth herein; rather, these embodiments are provided so that this disclosure will fully convey the scope of the invention to those skilled in the art. Thus, in some exemplary embodiments, well known technologies are not specifically explained. Unless otherwise defined, all terms used in the specification (including technical and scientific terms) may be used with meanings commonly understood by a person having ordinary knowledge in the art. Further, unless explicitly defined to the contrary, the terms defined in a generally-used dictionary are not ideally or excessively interpreted. In addition, unless explicitly described to the contrary, the word "comprise" and variations such as "comprises" or "comprising" will be understood to imply the inclusion of stated elements but not the exclusion of any other elements.

Unless specifically described to the contrary, a singular form includes a plural form.

As used herein, the term "and/or" includes any and all combinations of one or more of the associated listed items. Expressions such as "at least one of," when preceding a list of elements, modify the entire list of elements and do not modify the individual elements of the list.

It will be understood that, although the terms first, second, third, etc. may be used herein to describe various elements, components, regions, layers, and/or sections, these elements, components, regions, layers, and/or sections should not be limited by these terms. These terms are only used to distinguish one element, component, region, layer, or section from another element, component, region, layer, or section. Thus, a first element, component, region, layer, or section discussed below could be termed a second element, component, region, layer, or section without departing from the teachings of the present embodiments.

The terminology used herein is for the purpose of describing particular embodiments only and is not intended to be limiting. Unless specified otherwise, the term "or" means "and/or."

In the drawings, the thickness of layers, films, panels, regions, etc., are exaggerated for clarity. Like reference numerals designate like elements throughout the specification.

It will be understood that when an element such as a layer, film, region, or substrate is referred to as being "on" another element, it can be directly on the other element or intervening elements may also be present. In contrast, when an element is referred to as being "directly on" another element, there are no intervening elements present.

"About" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10% or 5% of the stated value.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

As used herein, when a definition is not otherwise provided, the term "substituted" refers to the case where in a compound or a group or a moiety, hydrogen is substituted with a substituent including a C1 to C30 alkyl group, a C2 to C30 alkenyl group, a C2 to C30 alkynyl group, a C6 to C30 aryl group, a C7 to C30 alkylaryl group, a C1 to C30 alkoxy group, a C1 to C30 heteroalkyl group, a C3 to C30 heteroalkylaryl group, a C3 to C30 cycloalkyl group, a C3 to C15 cycloalkenyl group, a C6 to C30 cycloalkynyl group, a C2 to C30 heterocycloalkyl group, a halogen (—F, —Cl, —Br, or —I), a hydroxy group (—OH), a nitro group (—NO$_2$), a thiocyanate group (—SCN), a cyano group (—CN), an amino group (—NRR', wherein R and R' are independently hydrogen or a C1 to C6 alkyl group), an azido group (—N$_3$), an amidino group (—C(=NH)NH$_2$), a hydrazino group (—NHNH$_2$), a hydrazono group (=N(NH$_2$), an aldehyde group (—C(=O)H), a carbamoyl group (—C(O)NH$_2$), a thiol group (—SH), an ester group (—C(=O)OR, wherein R is a C1 to C6 alkyl group or a C6 to C12 aryl group), a carboxylic acid group or a salt thereof (—C(=O)OM, wherein M is an organic or inorganic cation), a sulfonic acid group (—SO$_3$H) or a salt thereof (—SO$_3$M, wherein M is an organic or inorganic cation), a phosphoric acid group (—PO$_3$H$_2$) or a salt thereof (—PO$_3$MH or —PO$_3$M$_2$, wherein M is an organic or inorganic cation), or a combination thereof.

As used herein, when a definition is not otherwise provided, the term "hetero" refers to inclusion of at least one (e.g., one to three) heteroatom(s) including N, O, S, Si, or P.

As used herein the term "alkyl" refers to a monovalent linear or branched or cyclic saturated aliphatic hydrocarbon group (for example, optionally having at least one substituent). Unless otherwise provided, the alkyl group can have 1-60, or 1-30, or 1-16, or 1-6 carbon atoms, including any substituents.

As used herein, when a definition is not otherwise provided, the term "aliphatic hydrocarbon" refers to a C1 to C30 linear or branched hydrocarbon group (e.g., a C1 to C30 alkyl group, a C2 to C30 alkenyl group, a C2 to C30 alkynyl group).

As used herein, when a definition is not otherwise provided, the term "aromatic group" refers to a C6 to C30 aryl group or a C2 to C30 heteroaryl group.

As used herein, unless a definition is otherwise provided, "alkoxy" means an alkyl group that is linked via an oxygen (i.e., alkyl-O—), for example methoxy, ethoxy, and sec-butyloxy groups. Unless otherwise indicated, the alkoxy group can have 1-60, or 1-30, or 1-16, or 1-6 carbon atoms, including any substituents.

As used herein, unless a definition is otherwise provided, "alkynyl" means a straight or branched chain, monovalent hydrocarbon group having at least one carbon-carbon triple bond (e.g., ethynyl). Unless otherwise indicated, the alkyl group can have 1-60, or 1-30, or 1-16, or 1-6 carbon atoms, including any substituents.

As used herein, unless a definition is otherwise provided, "arene" means a hydrocarbon having an aromatic ring, and includes monocyclic and polycyclic hydrocarbons wherein the additional ring(s) of the polycyclic hydrocarbon may be aromatic or nonaromatic. Specific arenes include benzene, naphthalene, toluene, and xylene.

As used herein, unless a definition is otherwise provided, "aryl" means a monovalent group formed by the removal of one hydrogen atom from one or more rings of an arene (e.g., phenyl or naphthyl).

As used herein, unless a definition is otherwise provided, "arylalkyl" means a substituted or unsubstituted aryl group covalently linked to an alkyl group that is linked to a compound (e.g., a benzyl is a C7 arylalkyl group).

As used herein, "alkenyl" refers to a linear or branched monovalent hydrocarbon group having one or more carbon-carbon double bond. Unless otherwise indicated, the alkenyl group can have 1-60, or 1-30, or 1-16, or 1-6 carbon atoms, including any substituents.

As used herein, unless a definition is otherwise provided, "cycloalkenyl" means a monovalent group having one or more rings and one or more carbon-carbon double bond in the ring, wherein all ring members are carbon (e.g., cyclopentyl and cyclohexyl).

As used herein, unless a definition is otherwise provided, "cycloalkyl" means a monovalent group having one or more saturated rings in which all ring members are carbon (e.g., cyclopentyl and cyclohexyl).

As used herein, unless a definition is otherwise provided, "cycloalkynyl" means a stable aliphatic monocyclic or polycyclic group having at least one carbon-carbon triple bond, wherein all ring members are carbon (e.g., cyclohexynyl).

As used herein, unless a definition is otherwise provided, "ester" refers to a group of the formula —O(C=O)Rx or a group of the formula —(C=O)ORx wherein Rx is C1 to C28 aromatic organic group or aliphatic organic group. An ester group includes a C2 to C30 ester group, and specifically a C2 to C18 ester group.

As used herein, unless a definition is otherwise provided, "heteroalkyl" is an alkyl group that comprises at least one heteroatom covalently bonded to one or more carbon atoms of the alkyl group. Each heteroatom is independently chosen from nitrogen (N), oxygen (O), sulfur (S), and or phosphorus (P).

As used herein, unless a definition is otherwise provided, "ketone" refers to a C2 to C30 ketone group, and specifically a C2 to C18 ketone group. Ketone groups have the indicated number of carbon atoms, with the carbon of the keto group being included in the numbered carbon atoms. For example, a C2 ketone group is an acetyl group having the formula CH3(C=O)—. Lead (Pb) or mercury (Hg) based quantum dots may be capable of absorbing light of a near infrared region. However, Pb or Hg based quantum dots include restricted elements under the Restriction of Hazardous Substances Directive, and thus may not be used in a large scale production for a commercial device due to problems that may be caused.

Except for indium phosphide, quantum dots (capable of absorbing light of a relatively long wavelength such as infrared light or near infrared light) based on the indium and a Group VA element may encounter many challenging problems during synthesis thereof.

For example, an indium antimonide based quantum dot may be prepared using an indium amide dissolved in trioctyl phosphine or oleylamine and an antimony amide. However, the present inventors have found that volatility of the antimony precursor may cause some problems in reproducibility.

An InSb quantum dot may be prepared using indium chloride dissolved in trioctylphosphine and antimony silylamide dissolved in toluene as a precursor and conducting a reaction in the presence of a superhydride (hereinafter, referred to as "co-reduction method"). However, according to the research of the present inventors, reproducibility problems may not be addressed and the quantum dot as prepared may have a poor size distribution, the yield may be low, and a relatively large amount of non-soluble side products may be produced.

In addition, the present inventors have found that when a silylamide of a Group VA element (e.g., antimony) is reacted as a precursor with indium chloride in an organic medium in the presence of a superhydride and the organic medium does not include trioctylphosphine, the indium-based quantum dots as prepared may be apt to aggregate and exhibit high resistance. Without wishing to be bound by any theory, it is believed that the prepared quantum dots may suffer from a relatively high degree of indium ion deficiency.

A method of an embodiment may produce quantum dots including a Group IIIA-VA compound and able to absorb light of relatively long wavelengths (e.g., in an infrared or near infrared region), emit light of relatively long wavelengths, or a combination thereof. In addition, the method may provide quantum dots with improved size distribution at improved reproducibility even without carrying out a size-selection process.

Thus, in an embodiment, a method of producing quantum dots including a Group IIIA-VA compound includes:

preparing a Group VA element precursor including a halide of a Group VA element and a first ligand including a phosphine compound or a first amine compound; and performing a reaction between the Group VA element precursor and a Group IIIA metal precursor in the presence of a reducing agent in an organic reaction medium including a second amine compound to form quantum dots including a Group IIIA-VA compound.

The method of an embodiment uses a new synthesis route for Group IIIA-VA compound quantum dots (QDs) by directly using pnictogen halide. In an embodiment, the halide of the Group VA element (e.g., phosphorous, antimony, arsenic, bismuth, or a combination thereof) may include a chloride, a bromide, an iodide, or a combination thereof. The halide of the Group VA element may include $PCl_3$, $SbCl_3$, $AsCl_3$, $BiCl_3$, $PBr_3$, $SbBr_3$, $AsBr_3$, $BiBr_3$, $PI_3$, $SbI_3$, $AsI_3$, $BiI_3$, or a combination thereof. The difficulties in a Group IIIA-VA compound (e.g., InSb or InAs) based QD synthesis are largely due to the lack of a suitable Group VA element precursor. As explained above, while the choice of the Sb silylamide precursor may be reasonable based on its moderate reactivity, the long reaction time for synthesizing the precursor and the batch-to-batch variation may cause low productivity and reproducibility. In an embodiment, the Group VA element precursor is formed by a reaction between a halide of a VA element and a first ligand, which may achieve a more practically feasible route due to its low cost and easier handling.

The Group VA element precursor may be prepared by dissolving the halide of the Group VA element in the first ligand (e.g., a phosphine compound, a first amine compound, or a combination thereof) optionally at a temperature of greater than or equal to about 30° C., for example, greater than or equal to about 40° C., greater than or equal to about 50° C., greater than or equal to about 60° C., greater than or equal to about 70° C., greater than or equal to about 75° C., or greater than or equal to about 80° C., greater than or equal to about 85° C., greater than or equal to about 90° C., or greater than or equal to about 95° C. and less than or equal to about 200° C., less than or equal to about 150° C., less than or equal to about 130° C., less than or equal to about 120° C., less than or equal to about 110° C., or less than or equal to about 100° C.

As used herein, a "phosphine compound" is an organophosphorus compound or an oxide thereof that is not the same as the halide of the Group VA element when the Group VA element is phosphorus (e.g., $PCl_3$ or $PBr_3$). The phosphine compound may include a (e.g., at least one, two, or three) C1 to C40 aliphatic hydrocarbon, a (e.g., at least one, two, or three) C6 to C40 aromatic hydrocarbon, or a combination thereof, which is linked to a phosphorous atom.

The phosphine compound may include $R_3PO$, $R_2HPO$, $RH_2PO$, $R_3P$, $R_2PH$, $RPH_2$, $RPO(OH)_2$, $RHPOOH$, RHPOOH, R$_2$POOH, or a combination thereof, wherein each R is independently a substituted or unsubstituted C5 to C40 aliphatic hydrocarbon, a substituted or unsubstituted C6 to C40 aromatic hydrocarbon, or a combination thereof.

The phosphine compound may include an alkyl or aryl phosphine such as R$_3$P or R$_2$PH. The phosphine compound may include trioctylphosphine, diphenylphosphine, or a combination thereof.

The first amine compound may include a C1 to C40 aliphatic hydrocarbon, a C6 to C40 aromatic hydrocarbon, or a combination thereof. The amine compound may include RNH$_2$, R$_2$NH, or a combination thereof, wherein each R is independently a substituted or unsubstituted C5 to C40 aliphatic hydrocarbon, a substituted or unsubstituted C6 to C40 aromatic hydrocarbon, or a combination thereof.

The amine compound may include an amine including a C6 to C40 alkenyl group, an amine including a C6 to C40 alkyl group, or a combination thereof. In an embodiment, the first amine compound may not include a tertiary amine.

The halide of the Group VA element may be dissolved in the first ligand to form a (e.g., transparent) solution or liquid. The transparent solution may maintain its color or transparency or both even at a temperature of greater than or equal to about 60° C., for example, greater than or equal to about 80° C. and less than or equal to about 100° C., for example, less than or equal to about 90° C. The color of the solution or the liquid (e.g., the halide of the Group VA element in trioctylphosphine (TOP)) may be changed when the solution or liquid is mixed with the organic reaction medium that will be described later (e.g., the second amine compound), which may indicate that a small amount of the halide of the VA element is reduced. In an embodiment, the Group VA element precursor may be configured to be solidified at room temperature. For example, the melting point of the first organic ligand (e.g., oleyl amine) is below room temperature (25° C.), and the precursor may be a solid at room temperature and may be in the form of a liquid at a relatively high temperature (e.g., of greater than or equal to about 60° C., greater than or equal to about 70° C., greater than or equal to about 75° C., or greater than or equal to about 80° C.).

A molar ratio of the first ligand with respect to the halide of the Group VA element may be selected appropriately and is not particularly limited. The Group VA element precursor as prepared may have an NMR peak different from the first organic ligand, which may indicate the formation of a complex between the halide of the Group VA element and the first organic ligand.

The preparation of the Group VA element precursor may include adding a non-solvent to the prepared solution to precipitate a solid including the Group VA element precursor. Examples of the non-solvent may include a C1 to C10 alcohol, a ketone solvent, a nitrile solvent, or a combination thereof. Filtering the precipitated solid and drying the same may provide a powder of the Group VA element precursor. The powder of the precursor may further provide easy handling and may contribute to producing quantum dots more at a reduced cost.

The prepared Group VA element precursor may react with a Group IIIA metal precursor in the presence of a reducing agent in the organic reaction medium including a second amine compound to form quantum dots including a Group IIIA-VA compound.

The Group IIIA metal precursor may include indium, gallium, or a combination thereof. The Group IIIA metal precursor may include an amine group, a halide moiety, or a combination thereof. The Group IIIA metal precursor may include indium chloride, indium iodide, indium bromide, gallium chloride, gallium iodide, gallium bromide, aluminum chloride, aluminum iodide, aluminum bromide, or a combination thereof. In an embodiment, a Group IIIA metal precursor may be first degassed at a state dissolved in the aforementioned first or second amine compound (e.g., a primary amine with a C6 to C30 alkyl or alkenyl group) at an elevated temperature (e.g., greater than or equal to about 90° C., for example, greater than or equal to about 100° C., greater than or equal to about 110° C., or greater than or equal to about 120° C.), prior to the reaction.

The reducing agent may include a hydride reducing agent. The hydride reducing agent may be a superhydride. The hydride reducing agent may include lithium aluminum hydride; trialkoxyaluminum hydride such as LiAl(OtBu)$_3$H, LiAl(OMe)$_3$H, or the like; aluminum hydride such as sodium bis(2-methoxyethoxy)aluminum hydride, diisobutylaluminum hydride; sodium borohydride; lithium borohydride; borane; sodium cyanoborohydride; lithium trialkylborohydride such as lithium triethylborohydride; or a combination thereof. The reducing agent may be dissolved in an organic solvent miscible with the second amine compound (that will be described below) (e.g., an ether such as dioctyl ether, toluene, hexane, tetrahydrofuran, chloroform, or a combination thereof) and then be injected into a reaction system. The reducing agent may reduce both of the Group IIIA metal precursor and the Group VA element precursor.

The second amine compound included in the organic reaction medium may include a C1 to C40 aliphatic hydrocarbon, a C6 to C40 aromatic hydrocarbon, or a combination thereof. The second amine compound may include oleyl amine, octyl amine, dioctyl amine, or a combination thereof. The first amine and the second amine may be the same compound. Details of the second amine are the same as set forth above for the first amine compound. In an embodiment the second amine compound may not be a tertiary amine.

The reaction may be carried out at a temperature of greater than or equal to greater than or equal to about 200° C., for example, greater than or equal to about 210° C., greater than or equal to about 220° C., greater than or equal to about 230° C., greater than or equal to about 240° C., greater than or equal to about 250° C., greater than or equal to about 260° C., greater than or equal to about 270° C., greater than or equal to about 275° C., greater than or equal to about 280° C., greater than or equal to about 285° C., greater than or equal to about 290° C., greater than or equal to about 295° C., greater than or equal to about 300° C., greater than or equal to about 305° C., greater than or equal to about 310° C., greater than or equal to about 315° C., greater than or equal to about 320° C., greater than or equal to about 325° C., greater than or equal to about 330° C., greater than or equal to about 335° C., or greater than or equal to about 340° C.

The reaction temperature may be for example, less than or equal to about 380° C., less than or equal to about 360° C., less than or equal to about 350° C., less than or equal to about for example, 345° C., less than or equal to about for example, 340° C., less than or equal to about for example, 330° C., less than or equal to about 320° C., less than or equal to about 310° C., less than or equal to about 300° C., or less than or equal to about 290° C.

The performing of the reaction may include heating the organic reaction medium including the reducing agent, the Group IIIA metal precursor, and the Group VA element precursor at a predetermined rate (e.g., at least about 1° C./min, 2° C./min, 3° C./min, or higher).

The reaction may be performed in the absence of a phosphine compound. Without wishing to be bound by any theory, it is believed that the use of the trioctylphosphine may lead to the production of elongated particles and exclusion of the trioctylphosphine, for example, prior to the formation of the particle (or during the reaction) may ensure a production of a population of more uniform particles.

The reaction may be carried out in the absence of a tertiary amine (such as trioctylamine).

In the above method, types and amounts of the halide of the VA element, the Group IIIA metal precursor, and the reducing agent may be selected considering a desired quantum dot, and reactivity among the precursors.

In an embodiment, an amount of the halide of the Group VA element may be less than or equal to about 1 mole, for example, less than or equal to about 0.9 moles, less than or equal to about 0.8 moles, less than or equal to about 0.7 moles, or less than or equal to about 0.6 moles, per one mole of the Group IIIA metal element. In an embodiment, an amount of the halide of the Group VA element may be greater than or equal to about 0.1 moles, for example, greater than or equal to about 0.2 moles, greater than or equal to about 0.3 moles, or greater than or equal to about 0.4 moles, per one mole of the Group IIIA metal element.

In an embodiment, an amount of the reducing agent may be greater than or equal to about 0.5 moles, for example, greater than or equal to about 1 mole, greater than or equal to about 1.5 moles, greater than or equal to about 2 moles, greater than or equal to about 2.5 moles, or greater than or equal to about 3 moles, per one mole of the Group IIIA metal element. An amount of the reducing agent may be less than or equal to about 6.25 moles, for example, less than or equal to about 6.2 moles, less than or equal to about 6.1 moles, less than or equal to about 6 moles, less than or equal to about 5.9 moles, less than or equal to about 5.5 moles, less than or equal to about 5 moles, or less than or equal to about 4.5 moles, per one mole of the Group IIIA metal element. The amount of the reducing agent may affect the size of the quantum dots as prepared. In the method of an embodiment, the aforementioned amount of the reducing agent is used to provide quantum dots having an average size of greater than or equal to about 4.5 nm. In an embodiment, when the reducing agent is used in an amount of about 4 moles per one mole of the metal precursor, the quantum dots (e.g., InSb quantum dots) having a size of about 4.5 nm may be prepared. When the reducing agent is used in an amount of about 3 moles per one mole of the metal precursor, the quantum dots (e.g., InSb quantum dots) having an average size of at least about 5 nm (e.g., greater than or equal to about 6 nm or greater than or equal to about 6.5 nm) may be prepared.

The method may further include treating the quantum dots as formed including a Group IIIA-VA compound with a (Group IIIA) metal halide-alkyl phosphine (e.g., $InCl_3$-TOP).

After the completion of the reaction, the resulting reaction solution may be cooled to room temperature and a substituted or unsubstituted aliphatic (alkyl or alkenyl) (mono) carboxylic acid compound (e.g., oleic acid or the like) may be added thereto to neutralize any excess amount of the reducing agent that is otherwise present on the crude reaction solution. The carboxylic acid compound (e.g., oleic acid or the like) may be attached as a ligand to a surface of the quantum dot thus prepared. The neutralized crude reaction solution may be subjected to an appropriate separation process (e.g., centrifugation) to provide Group IIIA-VA compound quantum dots.

In addition to or instead of the aforementioned ligand, the quantum dots may optionally include an alkylammonium halide (e.g., an alkylammonium iodide, an alkylammonium chloride, or a combination thereof), a carboxylic acid compound including a thiol group, a thiocyanate (SCN) compound, $Na_2S$, $NOBF_4$, alkali azide, or a combination thereof. The optional inclusion of the foregoing ligand may be carried out with a proper ligand exchange process in a suitable solvent, in the form of a film (e.g., in a solid state), or a combination thereof including the quantum dots. In an embodiment, the ligand exchange may be carried out by preparing a quantum dot dispersion (e.g., including the quantum dots in an aromatic/aliphatic hydrocarbon solvent such as toluene), preparing an organic ligand solution wherein an organic ligand to be exchanged is dissolved in a solvent immiscible with the quantum dot dispersion (e.g., a formamide solution of $Na_2S$ or the like), contacting the quantum dot solution with the organic ligand solution and involving a phase transfer, whereby the quantum dots are transferred from the quantum dot dispersion to the organic ligand solution. In an embodiment, the ligand exchange may be carried out by contacting the quantum dots with the organic ligand compound in a suitable (organic) solvent. In an embodiment, the ligand exchange may be carried out by contacting an organic ligand solution with a quantum dot film (in a solid state).

The treating of the plurality of quantum dots may include both the phase transfer process explained above in the solution phase prior to the formation of the semiconductor layer and a solid state process explained above after followed the formation of the semiconductor layer.

Unlike CdS, CdSe, CdTe, PbS, PbSe, PbTe, HgS, HgSe, HgTe, and the like, the Group IIIA-VA compound quantum dots of the embodiments do not include toxic metals while they may have a narrow energy bandgap to absorb light of relatively long wavelength (for example, infrared light of a wavelength of at least 800 nm, at least 900 nm, at least 1,000 nm, at least 1100 nm, at least 1200 nm, at least 1300 nm, at least 1400 nm, at least 1,500 nm or even longer). The semiconductor layer including the Group IIIA-VA compound quantum dots may be used in a solar cell, an image sensor, a light absorption layer of an infrared (IR) sensor, a channel material for a field effect transistor (FET), a light emitting material for a near infrared (NIR) QD light emitting diode (LED), a thermoelectric material, or the like.

Thus, an embodiment provides a plurality of quantum dots obtained by the aforementioned method.

The plurality of quantum dots may have a molar ratio of the Group VA element with respect to the Group IIIA metal (e.g., the indium) of greater than or equal to about 0.6:1, greater than or equal to about 0.7:1, greater than or equal to about 0.8:1, greater than or equal to about 0.9:1, greater than or equal to about 1:1, greater than or equal to about 1.01:1, greater than or equal to about 1.05:1, or greater than or equal to about 1.1:1 and less than or equal to about 1.3:1, for example, less than or equal to about 1.25:1, less than or equal to about 1.20:1, less than or equal to about 1.19:1, less than or equal to about 1.18:1, less than or equal to about 1.15:1, less than or equal to about 1.13:1, less than or equal to about 1.12:1, less than or equal to about 1.1:1, less than or equal to about 1.09:1, less than or equal to about 1.08:1, less than or equal to about 1.07:1, less than or equal to about 1.06:1, less than or equal to about 1.05:1, less than or equal to about 1.04:1, less than or equal to about 1.03:1, less than or equal to about 1.02:1, or less than or equal to about 1.01:1. In the plurality of the quantum dots, the molar ratio of the Group VA element with respect to the indium may be greater than about 1.12:1.

The molar ratio may be determined by any proper analysis method such as an inductively coupled plasma atomic emission spectroscopy, an energy dispersive spectroscopic analysis, or the like, but it is not limited thereto.

The quantum dots of an embodiment may include a primary amine including a C6 to C30 aliphatic hydrocarbon and a monocarboxylic acid including a C6 to C30 aliphatic hydrocarbon. The quantum dots may not exhibit peaks that are assigned to a hydrogen atom closest to the amine or carboxylic group.

The quantum dots may include a zinc blende crystalline structure. In a transmission electron microscopy analysis, the quantum dot as prepared may exhibit formation of a super-lattice structure. The aforementioned method may provide a quantum dot having a zinc blende crystalline structure even when an excess amount of the Group IIIA metal precursor (for example, two times the amount of the Group VA element precursor) is used, and the quantum dots as prepared may not exhibit a wurtzite crystalline structure.

For example, even when the quantum dots are subject to a size selection process, the plurality of quantum dots prepared may have an improved level of a particle size distribution. Therefore, the quantum dots as prepared may have a particle size distribution of less than 15%, for example, 14%, less than or equal to about 13%, less than or equal to about 12%, less than or equal to about 11%, less than or equal to about 10%, less than or equal to about 9%, less than or equal to about 8%, less than or equal to about 7%, less than or equal to about 6%, or less than or equal to about 5% of an average size thereof.

According to the aforementioned method, the plurality of the quantum dots thus prepared may have an average size of greater than or equal to about 2 nm, greater than or equal to about 2.5 nm, greater than or equal to about 3 nm, greater than or equal to about 3.5 nm, greater than or equal to about 4 nm, greater than or equal to about 4.5 nm, greater than or equal to about 5 nm, greater than or equal to about 5.5 nm or greater than or equal to about 6 nm. The plurality of the quantum dots thus prepared may have an average size of less than or equal to about 50 nm, for example, less than or equal to about 40 nm, less than or equal to about 35 nm, less than or equal to about 30 nm, less than or equal to about 25 nm, less than or equal to about 20 nm, less than or equal to about 19 nm, less than or equal to about 18 nm, less than or equal to about 17 nm, less than or equal to about 16 nm, less than or equal to about 15 nm, less than or equal to about 14 nm, less than or equal to about 13 nm, less than or equal to about 12 nm, less than or equal to about 11 nm, less than or equal to about 10 nm, or less than or equal to about 9 nm.

The plurality of quantum dots may include InSb, InAs, $InAs_xSb_{1-x}$, $In_yGa_{1-y}Sb$, $In_yGa_{1-y}As_xSb_{1-x}$ or a combination thereof wherein x is greater than 0 and less than 1 and y is greater than 0 and less than 1.

Even without a size selection process, the plurality of quantum dots thus prepared may have exhibit a (e.g., relatively sharp) first absorption peak in a wavelength range of greater than or equal to about 1,300 nm, for example, greater than or equal to about 1,400 nm, greater than or equal to about 1,450 nm, or greater than or equal to about 1,500 nm, and less than or equal to about 1,800 nm, for example, less than or equal to about 1,700 nm, less than or equal to about 1,600 nm, or less than or equal to about 1,550 nm in a UV-Vis absorption spectroscopy analysis.

For example, when the excitation is made by light of a predetermined wavelength (e.g., at least 600 nm, about 620 nm or longer, for example), a photoluminescent spectrum of the plurality of quantum dots may have a photoluminescent peak in a region of an infrared region (e.g., greater than about 700 nm, greater than about 800 nm, greater than about 900 nm, greater than or equal to about 1,000 nm, greater than or equal to about 1,100 nm, greater than or equal to about 1,200 nm, greater than or equal to about 1,300 nm, greater than or equal to about 1,400 nm, or greater than or equal to about 1,500 nm and less than or equal to about 2,000 nm, less than or equal to about 1,900 nm, less than or equal to about 1,800 nm, less than or equal to about 1,700 nm, less than or equal to about 1,600 nm).

In the quantum dots, the Group VA element may include at least two of antimony (Sb), arsenic (As), and bismuth. The Group VA element may include antimony (Sb) and arsenic (As). In the quantum dots, a molar ratio of the antimony with respect to the arsenic may be greater than or equal to about 0.1:1, greater than or equal to about 0.11:1, greater than or equal to about 0.12:1, or greater than or equal to about 0.13:1 and less than or equal to about 9:1, less than or equal to about 8.5:1, less than or equal to about 8:1, or less than or equal to about 7.5:1, for example, as determined by an energy dispersive spectroscopic analysis. The quantum dots may have a peak (e.g., a (111) diffraction peak) in a range of greater than about 23 degrees and less than about 25 degrees in 2 theta of a X ray diffraction spectrum.

In an absorption spectrum, the quantum dots may have an absorption peak in a range of greater than or equal to about 900 nm (or greater than or equal to about 1,000 nm or greater than or equal to about 1,100 nm) and less than or equal to about 1,600 nm (or less than or equal to about 1,500 nm or less than or equal to about 1,400 nm).

In an absorption spectrum, the quantum dots may have a photoluminescent peak in a range of greater than or equal to about 1,000 nm (or greater than or equal to about 1,100 nm, or greater than or equal to about 1,200 nm) and less than or equal to about 1,700 nm (less than or equal to about 1,650 nm, less than or equal to about 1,600 nm, or less than or equal to about 1,500 nm or less than or equal to about 1,450 nm).

In an embodiment, quantum dots do not include cadmium, lead, or mercury while the quantum dots include a Group IIIA-VA compound, wherein the Group IIIA-VA compound include a Group IIIA metal including indium and optionally gallium, aluminum, or a combination thereof, and a Group VA element, and the Group VA element includes at least two of antimony (Sb), arsenic (As), and bismuth (Bi), and a molar ratio of the Group VA element with respect to the Group IIIA metal is less than or equal to about 1.5:1, for example, less than or equal to about 1.44:1, less than or equal to about 1.4:1, less than or equal to about 1.3:1 or less than or equal to about 1.2:1. The quantum dots may have a zinc blende crystalline structure. Details of the quantum dots set forth above may also be applied to these embodiments.

In an embodiment is provided a device including the aforementioned quantum dots. The device may include a solar cell, a photodetector, a field effect transistor, a flash memory, a photoelectric chemical device, or a combination thereof. The aforementioned quantum dots of an embodiment may be applied to a light absorption layer or a semiconductor layer for a solar cell and a photodetector, wherein the quantum dots even absorb light of visible wavelength and near infrared wavelength region to provide an electrical energy and signal. In addition, the quantum dots may be used in an n-type or p-type channel layer of a transistor and as a floating gate of the flash memory. The quantum dot may be used in a photoelectric conversion layer of a photo-electric chemical cell wherein when the device is irradiated with light, water is decomposed into hydrogen and oxygen or $CO_2$ is reduced to provide an organic compound.

An embodiment is related to a device including the aforementioned quantum dots, wherein the device includes a first electrode and a second electrode spaced apart from each other and a semiconductor layer including the aforementioned quantum dots. Major surfaces of the first electrode and the second electrode may face with each other. The semiconductor layer may be interposed between the first electrode and the second electrode.

The semiconductor layer may include an alkylammonium halide (e.g., an alkylammonium iodide, an alkylammonium chloride, or a combination thereof), a carboxylic acid compound including a thiol group, a thiocyanate (SCN) compound, $Na_2S$, $NOBF_4$, an alkali azide or a combination thereof. By the inclusion of the aforementioned compound, surfaces of quantum dots included in the layer may have a reduced interparticle distance, and thereby a carrier transport between the quantum dots in the semiconductor layer may be enhanced.

Manners of the surface treating of the quantum dots (or the semiconductor layer) are not particularly limited. In a non-limiting embodiment, after a semiconductor layer of a plurality of quantum dots is formed, an organic solution of any of the aforementioned ligand compound may be applied onto the semiconductor layer. The surface treating may be carried out by mixing the plurality of quantum dots with a first organic solution of the aforementioned ligand compound and stirring the same with an optional heating. The surface treatment may be carried out by preparing a second organic solution including the plurality of quantum dots and an organic solvent that is not miscible with the solvent of the first organic solution and contacting the same with the first organic solution of the aforementioned ligand compound to perform an phase transfer wherein the quantum dots transferred to the first organic solution and the ligand exchange occurs. The surface treatment may be carried out by firstly transferring the quantum dots into the organic solution containing the aforementioned ligand compounds, forming a semiconductor layer of plurality of quantum dots, and applying another solution of the aforementioned ligand compound onto the semiconductor layer.

The alkylammonium iodide may include tetrabutylammonium iodide.

The carboxylic acid compound may include mercapto propionic acid.

The thiocyanate (SCN) compound may include $NH_4SCN$.
The alkali azide compound may include sodium azide.

The semiconductor layer may be electrically connected to the first electrode, the second electrode, or a combination thereof.

A thickness of the semiconductor layer may be greater than or equal to about 10 nm, for example, greater than or equal to about 20 nm, greater than or equal to about 30 nm, greater than or equal to about 40 nm, greater than or equal to about 50 nm, or greater than or equal to about 100 nm. A thickness of the semiconductor layer may be less than or equal to about 1 micrometer (um), for example, less than or equal to about 900 nm, less than or equal to about 800 nm, less than or equal to about 700 nm, less than or equal to about 600 nm, less than or equal to about 500 nm, less than or equal to about 400 nm, less than or equal to about 300 nm, less than or equal to about 200 nm, less than or equal to about 100 nm, or less than or equal to about 60 nm.

In a device of an embodiment, the semiconductor layer may absorb near infrared light of a wavelength of greater than or equal to about 1 μm, for example, greater than or equal to about 1,100 nm, greater than or equal to about 1,200 nm, greater than or equal to about 1,300 nm, greater than or equal to about 1,400 nm, or greater than or equal to about 1,500 nm to generate a photocurrent.

The semiconductor layer may have a carrier (field effect hole) mobility of greater than or equal to about $10^{-4}$ $cm^2/Vs$, for example, greater than or equal to about $1 \times 10^{-3}$ $cm^2/Vs$.

The electronic device may be configured to have a field effect electron mobility of greater than or equal to about 0.5 square centimeters per volt-second ($cm^2/Vs$), greater than or equal to about 1 $cm^2/Vs$, or greater than or equal to about 2 $cm^2/Vs$.

The electronic device may be configured to have a field effect electron mobility of greater than or equal to about 4 square centimeters per volt-second ($cm^2/Vs$) or of greater than or equal to about 5 $cm^2/Vs$.

The semiconductor layer may have a field effect electron mobility of greater than or equal to about 5.5 $cm^2/Vs$.

In a device of an embodiment, the semiconductor layer may be configured to have a responsivity of greater than or equal to about $3 \times 10^{-3}$ A/W when it is irradiated with light of a wavelength of about 1.55 μm.

In a device of an embodiment, the semiconductor layer may be configured to have a responsivity of greater than or equal to about $2 \times 10^{-3}$ A/W when it is irradiated with light of a wavelength of about 1.55 μm.

In a device of an embodiment, the semiconductor layer may be configured to show an external quantum efficiency of greater than or equal to about $2 \times 10^{-3}$ (i.e., greater than or equal to about 0.2% or greater than or equal to about 0.25%) when it is irradiated with light of a wavelength of about 1.55 μm. The device may include a carrier auxiliary layer between the semiconductor layer and the first electrode, between the semiconductor layer and the second electrode, or both. The carrier auxiliary layer may include an electron transport layer, a hole transport layer, or a carrier (electron, hole, or a combination thereof) blocking layer. The carrier auxiliary layer may include a metal oxide. The metal oxide may include a molybdenum oxide, a zinc oxide, or a combination thereof.

In an embodiment, the electronic device may be a field effect transistor. The device may further include a third electrode facing (or opposite to) the semiconductor layer and an insulation layer interposed between the semiconductor layer and the third electrode.

The electronic device may be configured to have a field effect hole mobility of greater than or equal to about $10^{-5}$ $cm^2/Vs$. The electronic device may be configured to have a field effect hole mobility of greater than or equal to about $10^{-4}$ $cm^2/Vs$ for example, greater than or equal to about $1 \times 10^{-3}$ $cm^2/Vs$ or greater than or equal to about $2.5 \times 10^{-3}$.

In an embodiment, the semiconductor layer may contact with the first electrode and the second electrode. The first electrode and the second electrode may be disposed in an interdigitated form. The spacing of the first electrode and the second electrode may be greater than or equal to about 1 μm, for example, greater than or equal to about 2 μm, greater than or equal to about 3 μm, greater than or equal to about 4 μm, or greater than or equal to about 5 μm.

FIG. 1A is a perspective view of an electronic device of an embodiment. Referring to FIG. 1A, a semiconductor layer (for example, including indium antimonide quantum dots (QDs)) may be disposed between a first electrode (e.g., a source electrode) and a second electrode (e.g., a drain electrode). The electronic device of an embodiment further includes a third electrode (e.g., a gate electrode) facing the semiconductor layer and an insulation layer may be disposed between the semiconductor layer and the third electrode. A surface of the semiconductor layer may be treated with the aforementioned organic compound.

Materials for the first electrode and the second electrode are not particularly limited and may be selected appropriately. Examples of the first electrode and the second electrode may include a metal such as gold, nickel, aluminum, platinum, or the like, a conductive polymer, and a conductive ink, but are not limited thereto. A thickness of the first electrode or the second electrode may be selected appropriately. For example, a thickness of the first electrode (or the second electrode) may be greater than or equal to about 40 nm, for example, about 100 nm and less than or equal to about 400 μm, but is not limited thereto.

Materials of a third electrode (e.g., a gate electrode) are not particularly limited and selected appropriately. For example, a third electrode may include a metal thin film, a conductive polymer film, a conductive film prepared from a conductive ink or paste, a doped silicon, or the like, but is not limited thereto. Examples of the third electrode may include aluminum, silver, chrome, indium tin oxide, poly(3,4-ethylene dioxythiopene) doped with polystyrene sulfonic acid (PSS:PEDOT), carbon black/graphite in a polymeric binder, or a conductive ink/paste such as a colloidal silver dispersion or an Ag ink, but are not limited thereto. A third electrode layer may be prepared by vacuum deposition or sputtering of a metal or a conductive metal oxide, a spin coating of a conductive polymer solution or a conductive ink, a coating via casing or printing, or a doping of substrate, or the like. A thickness of a third electrode is not particularly limited and may be selected appropriately. For example, a thickness of a third electrode including a metal thin film may be greater than or equal to about 10 nm and less than or equal to about 200 nm. A thickness of a third electrode including a polymeric conductor may be greater than or equal to about 1 μm and less than or equal to about 10 μm. A gate electrode including a carbon composite such as a carbon nanotube (CNT) may have a thickness of greater than or equal to about 100 nm (e.g., 1 μm or greater) and less than or equal to about 10 μm. However, it is not limited thereto.

An insulation layer may separate the third electrode from the first electrode, the second electrode, and the semiconductor film (30). The insulation layer may include a thin film of an inorganic material or a film of an organic polymer. Examples of the inorganic material may include a silicon oxide, a silicon nitride, an aluminum oxide, a barium titanate, and a zirconium titanate, but are not limited thereto. Examples of an organic polymer may include a polyester, a polycarbonate, a poly(vinylphenol), a polyimide, a polystyrene, a poly(methacrylate), a polyacrylate, an epoxy resin, and the like but are not limited thereto. A thickness of the insulation layer may vary with a dielectric constant of the insulation material, and is not particularly limited. For example, the insulation layer may have a thickness of greater than or equal to about 10 nm, for example, greater than or equal to about 50 nm, or greater than or equal to about 100 nm, but it is not limited thereto. The thickness of the insulation layer may be less than or equal to about 2,000 nm, for example, less than or equal to about 500 nm, but is not limited thereto. A conductivity of the insulation layer may be less than or equal to about $10^{-12}$ siemens per centimeter (S/cm), but is not limited thereto.

The first electrode, the semiconductor layer, the insulation layer, and the second electrode may be formed in any order, which is not particularly limited.

Figure 1B:
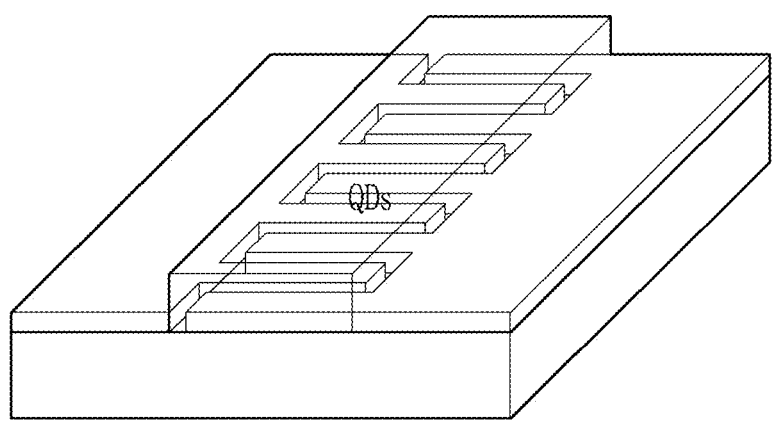
FIG. 1B is a schematic view of a device of an embodiment.

FIG. 1B shows a perspective view of an electronic device of an embodiment. Referring to FIG. 1B, the electronic device of the embodiment includes a first electrode and a second electrode spaced apart from each other and a semiconductor layer is disposed between the first and the second electrodes. The semiconductor layer may contact with the first and the second electrodes. Details of the electrodes and the semiconductor layer are the same as set forth above.

Figure 1C:
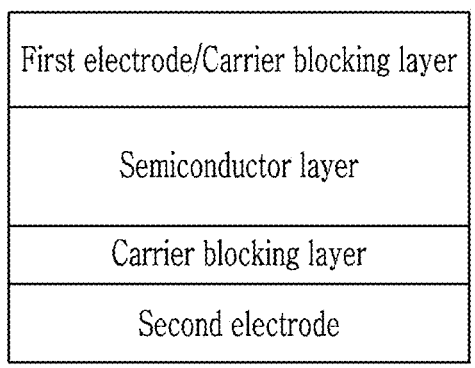
FIG. 1C is a schematic cross-sectional view of a device of an embodiment.

Each of FIG. 1C and FIG. 1D is a cross-sectional schematic view of an electronic device of an embodiment. Referring to FIG. 1C and FIG. 1D, the device of the embodiment includes a semiconductor layer disposed between a first electrode (e.g., indium thin oxide) and a second electrode (e.g., aluminum).

The device may form a metal-semiconductor Schottky Contact or a heterojunction photodiode. The semiconductor layer may include a p-type characteristic layer. The semiconductor layer may have an n-type characteristic layer. The semiconductor layer may have an i-type characteristic layer. The semiconductor layer may have multi-layered structure wherein each of the layers may be an n-type, i-type, p-type, or a combination thereof. A carrier auxiliary layer (e.g., a carrier transport layer, a carrier injection layer, or a carrier blocking layer, for example, including PEDOT:PSS, a metal oxide, LiF, or the like) may be disposed between the semiconductor layer and the first electrode. A carrier blocking layer (e.g., LiF) may be disposed between the semiconductor layer and the second electrode. A device may include a Schottky diode.

Hereinafter, the present invention is illustrated in more detail with reference to specific examples. However, they are exemplary embodiments of the present invention, and the present invention is not limited thereto.

EXAMPLES

1. Photoluminescence Analysis

A photoluminescence (PL) spectrum of the produced quantum dots are obtained using a spectrometer (Model name: FLS1000 manufactured by Edinburgh Instruments).

2. Ultraviolet (UV)-Vis-NIR Spectroscopy Analysis

UV spectroscopy analysis is performed using a UV spectrometer (Model name: Cary 5000 manufactured by Agilent) to obtain a UV-Visible NIR absorption spectrum.

3. Transmission Electron Microscopy (TEM) and Energy Dispersive X-ray Spectroscopy (EDS) Analysis Transmission electron microscopy analysis and EDS analysis are made using a transmission electron microscope (Model name: JEM1400 manufactured by JEOL).

4. Nuclear Magnetic Resonance (NMR) Spectroscopy Analysis

An NMR analysis is made by using an NMR instrument (Model name: DRX 500 manufactured by Bruker).

5. Electrical and Photoconductivity Measurement

The electrical and photoconductivity measurements are performed by using a semiconductor parameter analyzer (Model name: 4156C manufactured by Agilent).

6. Inductively Coupled Plasma (ICP) Analysis

An Inductively coupled plasma-optical emission spectrometry (ICP-OES) analysis is performed using a Spectro Genesis spectrometer.

Reference Example 1

$InCl_3$ and $SbCl_3$ (or $AsCl_3$ or $PCl_3$) stock solutions are prepared by dissolving the halide salts separately in oleylamine at ~50° C. overnight inside a glovebox. In the following examples, at room temperature, $InCl_3$— and $SbCl_3$— (or $AsCl_3$— or $PCl_3$—) oleylamine precursors are mixed in the reaction flask, followed by the injection of superhydride. It is then heated up to the reaction temperature at 3° C./minute (min) and kept at that temperature for 15 min before being cooled. The product solution is transferred into the glovebox for purification without air exposure.

Observation of the stock solutions of $PCl_3$, $AsCl_3$ and $SbCl_3$ in oleylamine (from left to right), after being stirred overnight at ~50° C., all three pnictogen halides are fully dissolved to form clear solutions. The $SbCl_3$ stock solution may be re-made more frequently. The solutions solidify upon cooling to room temperature. Chemical reaction occurs between oleylamine and pnictogen halides during the formation of the precursor solutions as suggested by two main observations.

First, by adding antisolvents (e.g., hexane, acetone, methanol, isopropanol, or ethanol), precipitation occurs and a powder form of the compound may be obtained from the precursor solution.

H-nuclear magnetic resonance (NMR) measurements (FIG. 2A) show the resonance energy of the hydrogen atom in oleylamine closest to the $NH_2$ group, denoted as "f", has a significant shift upon adding $AsCl_3$ into the oleylamine, consistent with chemical bond formation between $AsCl_3$ and $NH_2R$. The shift is independent of the presence of $InCl_3$, indicating the reaction between $AsCl_3$ and oleylamine is faster and predominant over reaction between $InCl_3$ and oleylamine. To note, the NMR is conducted at room temperature, therefore faster and more complete reactions are expected at elevated temperatures, just as observed experimentally where $InCl_3$ powders are hardly dissolved in oleylamine at room temperature but more readily dissolved at higher temperatures.

The NMR results of $SbCl_3$- and $PCl_3$-oleylamine solutions consistently follow the same trend.

Example 1

1. An $LiEt_3BH$ solution in dioctyl ether is prepared. $SbCl_3$ is placed in oleylamine to prepare a $SbCl_3$-oleylamine precursor (e.g., a complex).

The prepared $SbCl_3$-oleylamine precursor is liquid at a temperature of about 80° C., but is solidified at room temperature. The prepared $SbCl_3$-oleylamine precursor (liquid) is placed in chloroform and adding methanol (a non-solvent) to form a precipitate, which is then filtered to obtain a powder of the $SbCl_3$-oleylamine precursor.

An NMR analysis is made for the oleyl amine, the $SbCl_3$-oleylamine precursor (liquid), and the powder of the $SbCl_3$-oleylamine precursor and the results are shown in FIG. 2B.

The results of FIG. 2B confirm that the position of the peaks (e, f), which may be assigned to an alkyl adjacent to amine, is shifted (e peak is shifted from 1.45 parts per million (ppm) to 1.85 ppm, f peak is shifted from 2.7 ppm to 3.2 ppm). These results indicate that the $SbCl_3$ and the oleylamine form a complex.

2. To a three-neck flask including 12 milliliters (mL) of anhydrous degassed oleylamine, a solution containing $InCl_3$ in oleyl amine is added at room temperature, the prepared $SbCl_3$-oleylamine is added thereto and the $LiEt_3BH$ solution is injected to the flask.

Then, a reaction temperature is raised to 280° C. at the rate of about 3° C./min, the temperature is kept for 10 minutes.

The oleic acid (OA) is added the crude solution to neutralize the excess amount of the super-hydride, thereby oleate ligands are attached to a surface of the nanocrystal.

Then, the crude solution is centrifuged to recover the nanocrystals. The recovered nanocrystals are dispersed in toluene.

The amount of $SbCl_3$ with respect to 1 mole of $InCl_3$ is about 0.5 moles, and the amount of $LiEt_3BH$ is about 4 moles.

3. For the prepared quantum dots, an ultraviolet-visible-near infrared (UV-Vis-NIR) spectroscopic analysis and a transmission electron microscopy analysis are made and the results are shown in FIG. 3 and FIG. 4.

Figure 3:
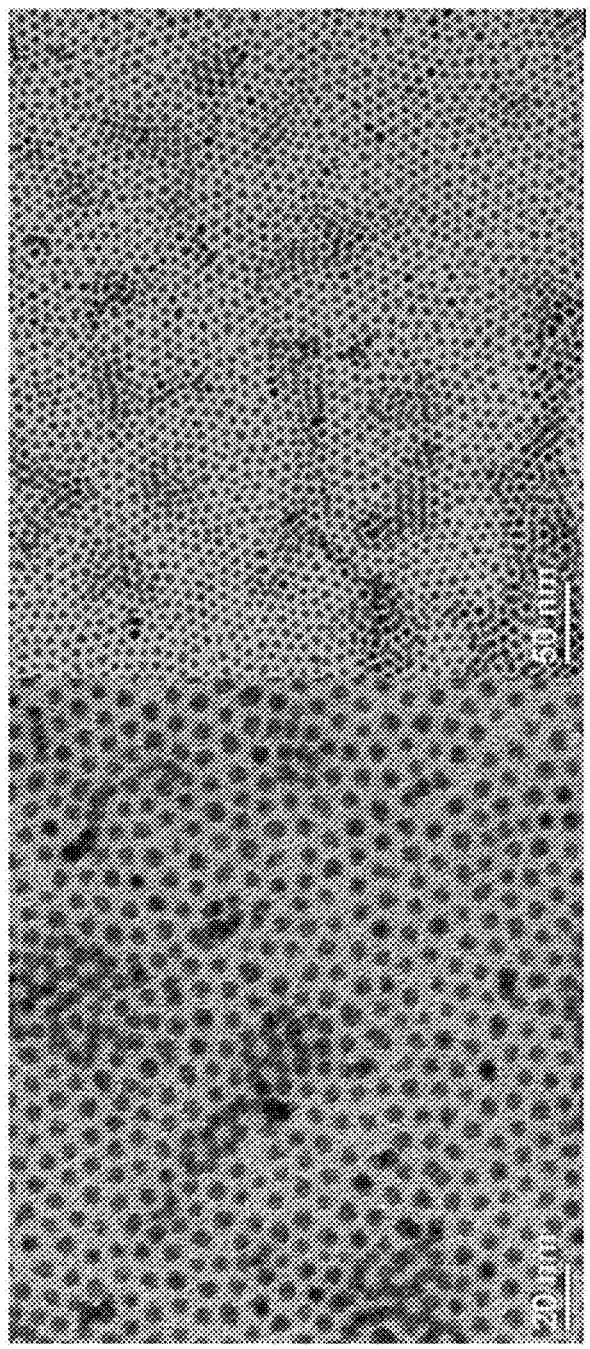
FIG. 3 is a transmission electron microscopic image of the quantum dots prepared in Example 1.
Figure 4:
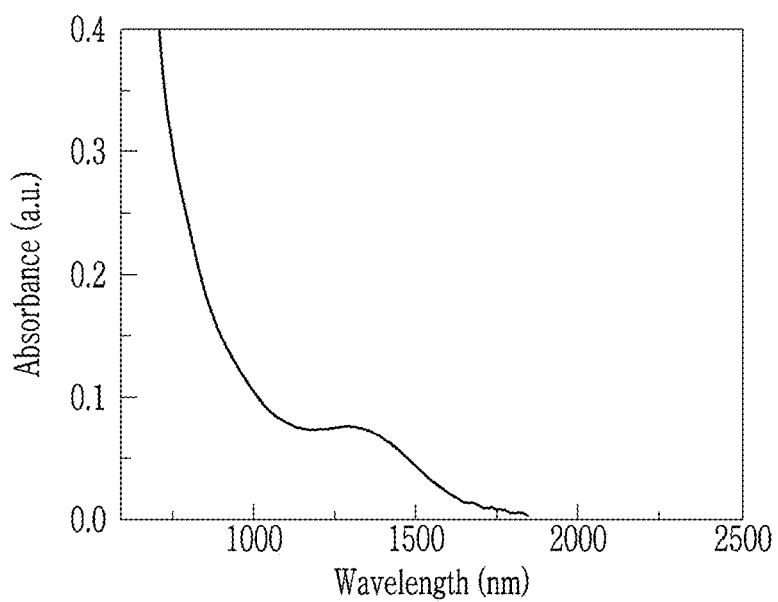
FIG. 4 is an ultraviolet-visible-near infrared (UV-Vis-NIR) absorption spectrum of the quantum dots prepared in Example 1.

The results of FIG. 3 and FIG. 4 confirm that the quantum dots as prepared have improved size uniformity even without any size selection process in comparison with the quantum dots prepared using Sb precursors. The sizes of the quantum dots may be about 4.7±0.7 nanometers (nm).

The results of the transmission electron microscopy with energy dispersive X-ray spectroscopy (TEM-EDS) analysis for the prepared quantum dots confirm that the molar ratio of Sb to In (Sb/In) is about 1.16:1. A UV-vis absorption spectroscopic analysis of the quantum dot as prepared confirms that their absorption peak is at about 1.3 micrometers (μm). The ICP-AES analysis confirm that the molar ratio of Sb/In is about 1.21:1.

Experimental Example 1: Effect of reaction temperature

Except for changing the reaction temperature into about 300° C. and 320° C., the InSb quantum dots are synthesized in the same manner as set forth in Example 1.

The results confirm that as the reaction temperatures are increased, the quantum dot (QD) size increases to obtain 5.9±0.6 nm and 6.4±0.6 nm, respectively.

Such results are consistent with the fact that the normalized absorption spectra show a peak red-shift from 1.3 μm to 1.5 μm and a 3-fold increase of absorption intensity at 1.55 μm when the reaction temperature is increased to 320° C.

Experimental Example 2

The existence of oxide may affect the transport of carriers between QDs. In order to reduce oxide formation in the InSb QDs, the oleylamine-$InCl_3$ precursor is first degassed at 120° C. before reaction. X-ray photoemission spectroscopy (XPS) results show the reduction of the oxide level, from 46.1% In binding to oxygen to 16.4%. The degassing process also affects the QD growth. With the degassing process, the QD size may increase (e.g., from 6.1±0.5 nm to 7.2±1.0 nm) and the absorption peak is red-shifted to ~1.75 μm.

Example 2A

1. The quantum dots are prepared in the same manner as set forth in Example 1 except that $SbCl_3$ is dissolved in trioctylphosphine (TOP) to prepare a $SbCl_3$-TOP precursor, which is then used for the precursor. The used amount of $SbCl_3$ with respect to 1 millimole (mmol) of $InCl_3$ is about 0.5 mmol.

2. For the prepared quantum dots, a UV-Vis-NIR spectroscopic analysis and a transmission electron microscopic analysis are made and the results are shown in FIG. 5 and FIG. 6.

Figure 5:
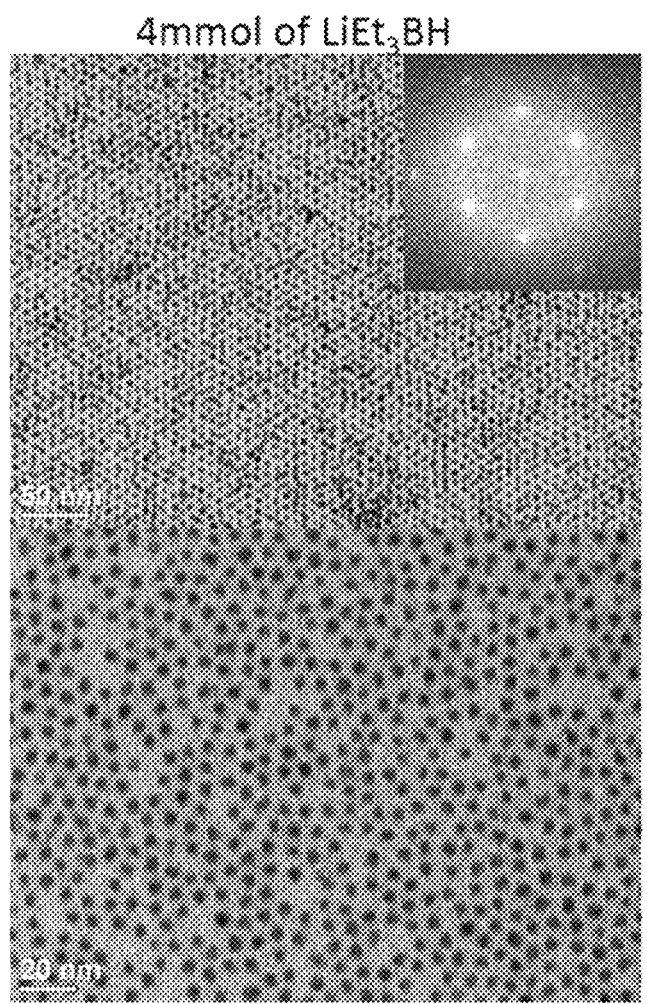
FIG. 5 is a transmission electron microscopy image of the quantum dots prepared in Example 2A.
Figure 6:
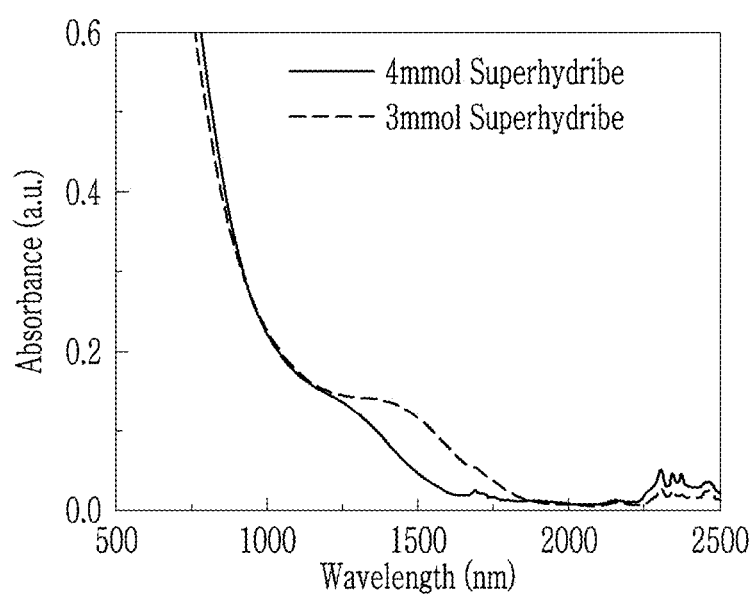
FIG. 6 is an UV-Vis-NIR absorption spectrum of the quantum dots prepared in Examples 2A and 2B.

The results of FIG. 5 and FIG. 6 confirm that the quantum dots as prepared have improved size uniformity even without any size selection process in comparison with the quantum dots prepared using Sb precursors.

The results of the TEM-EDS analysis for the prepared quantum dots confirm that the molar ratio of Sb to In (Sb/In)

is about 1.18:1. The ICP-AES analysis confirm that the molar ratio of Sb/In is about 1.25:1.

Example 2B

1. Quantum dots are prepared in the same manner as set forth in Example 1 except that $SbCl_3$ is dissolved in trioctylphosphine to prepare a $SbCl_3$-TOP precursor, which is then used for the precursor and the amount of the $LiEt_3BH$ is 3 mmol. The used amount of $SbCl_3$ with respect to $InCl_3$ 1 mmol is about 0.5 mmol.

2. For the prepared quantum dots, a UV-Vis spectroscopic analysis and a transmission electron microscopic analysis are made and the results are shown in FIG. 7 and FIG. 6.

Figure 7:
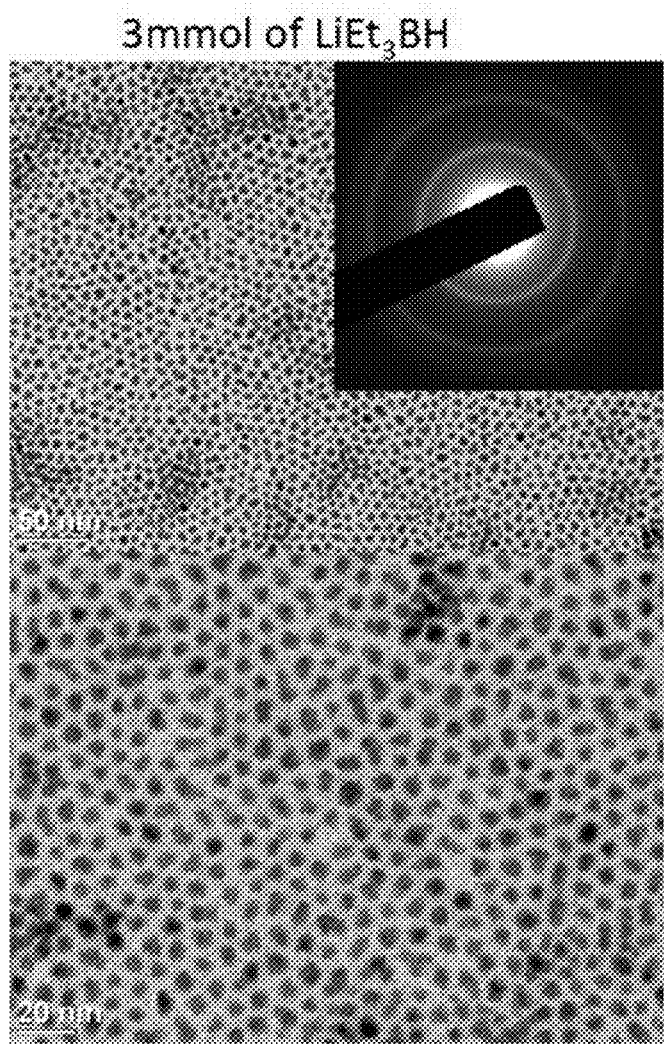
FIG. 7 is a transmission electron microscopic image of the quantum dots prepared in Example 2B.

The results of FIG. 7 and FIG. 6 confirm that the quantum dots as prepared have improved size uniformity even without any size selection process in comparison with the quantum dots prepared using the conventional Sb precursors.

The results of the TEM-EDS analysis for the prepared quantum dots confirm that the molar ratio of Sb to In (Sb/In) is about 1.18:1. The ICP-AES analysis confirm that the molar ratio of Sb/In is about 1.25:1.

Example 3A

1. Quantum dots are prepared in the same manner as set forth in Example 1 except that $AsCl_3$ is dissolved in oleylamine to prepare an $AsCl_3$-oleylamine precursor, and the reaction temperature is about 330° C., The used amount of $AsCl_3$ with respect to $InCl_3$ 1 mmol is about 0.5 mmol and the amount of the $LiEt_3BH$ is about 4.5 mmol.

2. For the prepared quantum dots, a transmission electron microscopic analysis is made and the results are shown in FIG. 8.

Figure 8:
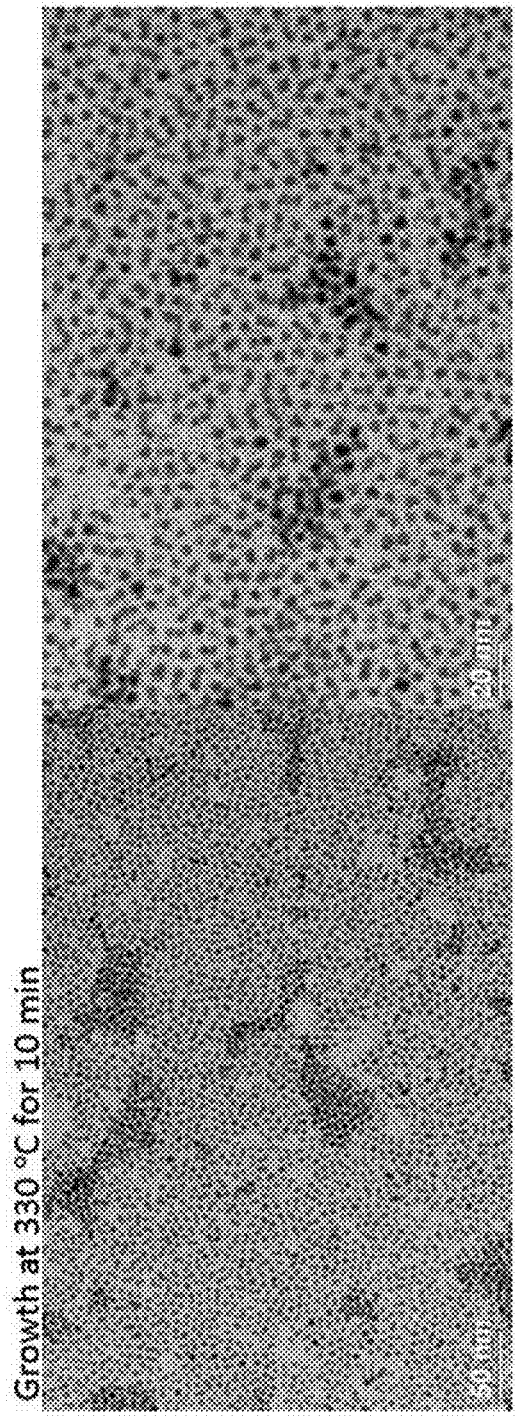
FIG. 8 is a transmission electron microscopic image of the quantum dots prepared in Example 3.

The results of FIG. 8 confirm that the quantum dots as prepared have improved size uniformity even without any size selection process in comparison with the quantum dots prepared using Sb precursors.

Example 3B

The colloidal InAs QDs solution prepared in Example 3A are subjected to a $NOBF_4$ treatment, specifically washing the QD dispersion with $NOBF_4$ acetonitrile solution. Enhanced photoluminescence (PL) is obtained and the PL peak position is slightly blue shifted. Without wishing to be bound by any theory, it is believed that dangling P bonds may form PF3 complexes with unpassivated P atoms, rendering In-rich surfaces, which lead to improved PL.

Comparative Example 1

A $LiEt_3BH$ solution in dioctyl ether is prepared. To a three-neck flask including 12 mL of anhydrous degassed oleylamine, premixed solution containing 1 mmol of $InCl_3$ and 0.5 mmol of $Sb[N(Si(Me)_3)_2]_3$ in 10 mL of oleyl amine is injected at room temperature and the $LiEt_3BH$ solution is injected to the flask.

Then, a reaction temperature is raised to 280° C. at the rate of about 3° C./min, the temperature is kept for 10 minutes.

The oleic acid (OA) is added the crude solution to neutralize the excess amount of the super-hydride, thereby oleate ligands are attached to a surface of the nanocrystal. Then, the crude solution is centrifuged to recover the nanocrystals. The recovered nanocrystals are dispersed in toluene.

3. For the prepared quantum dots, a UV-Vis spectroscopic analysis and a transmission electron microscopic analysis are made and the results are shown in FIG. 9 and FIG. 10.

Figure 9:
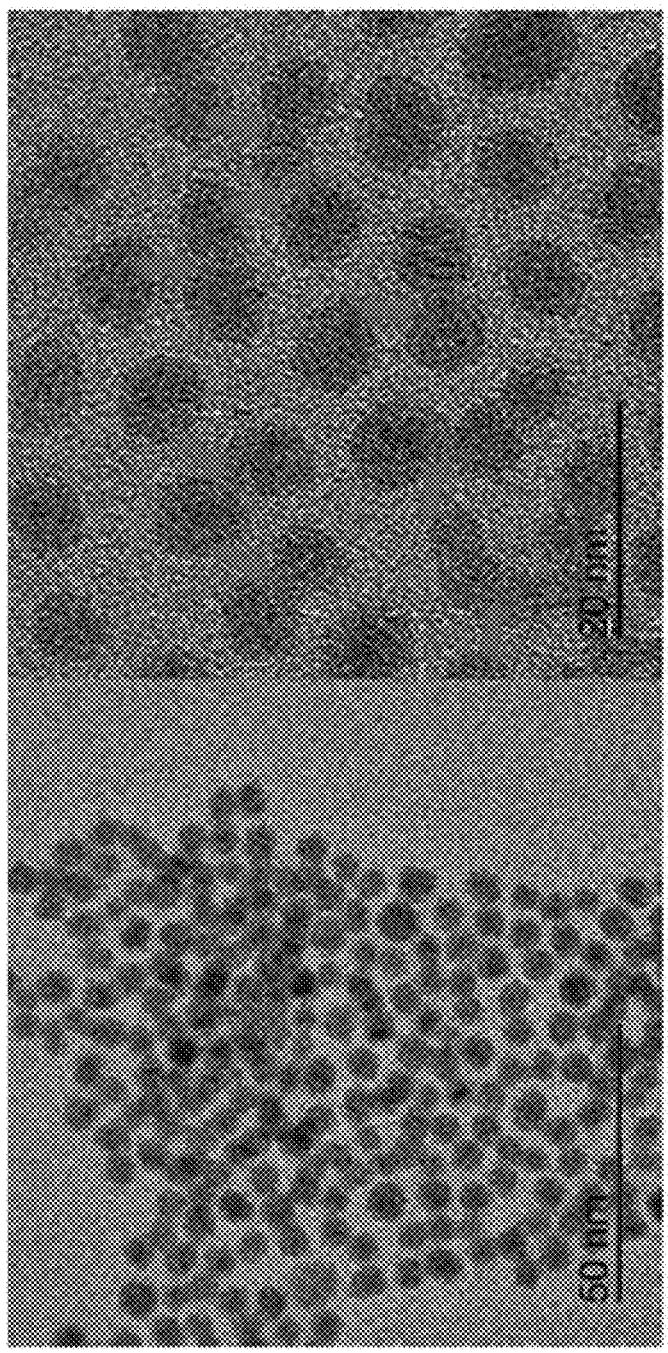
FIG. 9 is a transmission electron microscopic image of the quantum dots prepared in Comparative Example 1.
Figure 10:
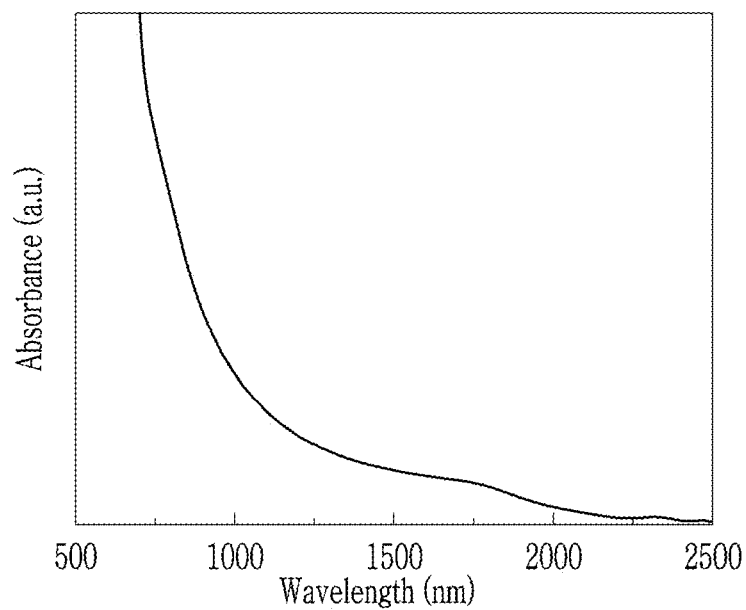
FIG. 10 is an UV-Vis-NIR absorption spectrum of the quantum dots prepared in Comparative Example 1.

The results of FIG. 9 and FIG. 10 confirm that the quantum dots of Comparative Example exhibit substantial aggregation and precipitation.

The results of the TEM-EDS analysis for the prepared quantum dots confirm that the molar ratio of Sb to In (Sb/In) is about 1.48:1.

Example 4A: Synthesis of $InAs_xSb_{1-x}$ QDs

The method of an embodiment allows for making ternary $InAs_xSb_{1-x}$ alloy QDs. In addition to QD size, modulating the stoichiometry of alloyed QDs also may make it possible to separately tailor the bandgap energy, energy levels, and carrier concentration. The addition of As may improve the colloidal and air stability of the QDs as well.

The $InAs_xSb_{1-x}$ QDs with various chemical compositions is prepared in the similar manner to Example 3 (e.g., a reaction temperature of about 330° C. and reaction time of about 15 minutes) except for altering the molar ratio of As and Sb precursors added in the beginning of the reaction as shown in the following table. The absorption spectroscopic measurements of the resulting quantum dots confirm that the absorption peak of the quantum dot red-shifts as the molar ratio of Sb precursor increases. The elemental composition of the alloy QDs is measured by EDS and the results are summarized in Table 1.

TABLE 1

| As to Sb precursor ratio | EDS elemental composition | | |
| --- | --- | --- | --- |
|  | In | As | Sb |
| InAs | 45 mole % | 55 mole % | — |
| $InAs_{0.9}Sb_{0.1}$ | 41 mole % | 52 mole % | 7 mole % |
| $InAs_{0.5}Sb_{0.5}$ | 45 mole % | 31 mole % | 24 mole % |
| $InAs_{0.1}Sb_{0.9}$ | 48 mole % | 6 mole % | 46 mole % |

The TEM measurements of the obtained particles confirm that the particle diameters are 3.0±0.3 nm (InAs), 3.1±0.3 nm ($InAs_{0.9}Sb_{0.1}$), 5.0±0.4 nm ($InAs_{0.5}Sb_{0.5}$) and 5.7±0.5 nm ($InAs_{0.1}Sb_{0.9}$).

It is believed that the addition of the Sb precursor may tend to facilitate particle growth. Meanwhile, the composition of QD may also play a role in determining the bandgap energies.

Figure 11:
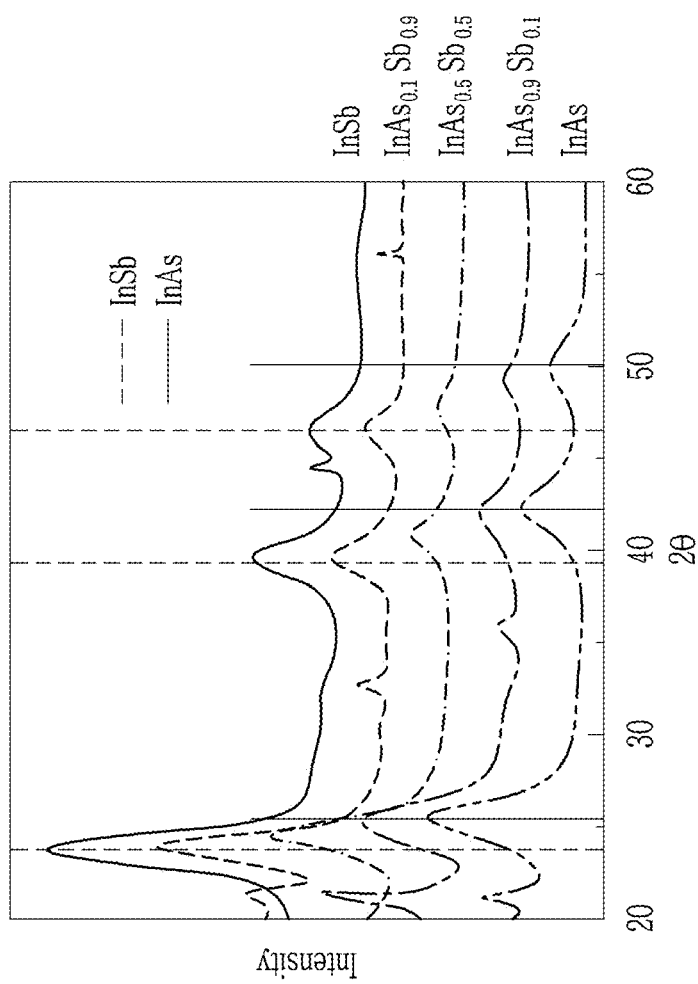
FIG. 11 is an XRD spectrum of the quantum dots prepared in Example 4A.

In order to determine the crystal structure of the alloy QDs, powder x-ray diffraction measurements are conducted and the results are shown in FIG. 11. The results of FIG. 11 confirm that the (111) diffraction peak has shifted from 25° (InAs phase) to 23° (InSb phase) in 26 as the composition changes from As rich to Sb rich, instead of showing the co-existence of the two pure phases. The lattice constant of $InAs_xSb_{1-x}$ QDs calculated from the XRD result is 0.612, 0.630, and 0.646 nm as x equals to 0.9, 0.5, and 0.1, respectively.

Figure 12:
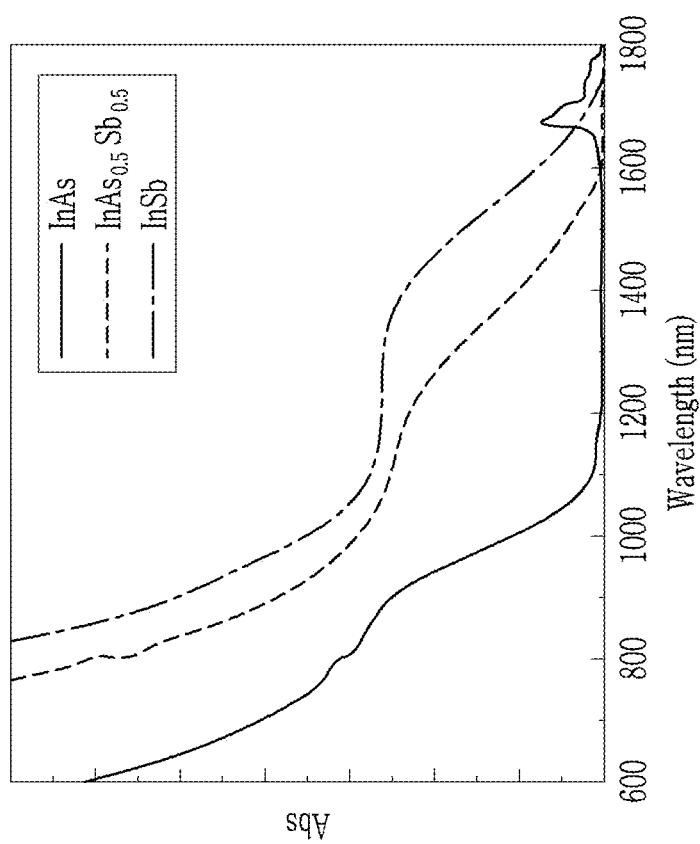
FIG. 12 is an UV-Vis-NIR absorption spectrum of the quantum dots prepared in Example 4A.
Figure 13:
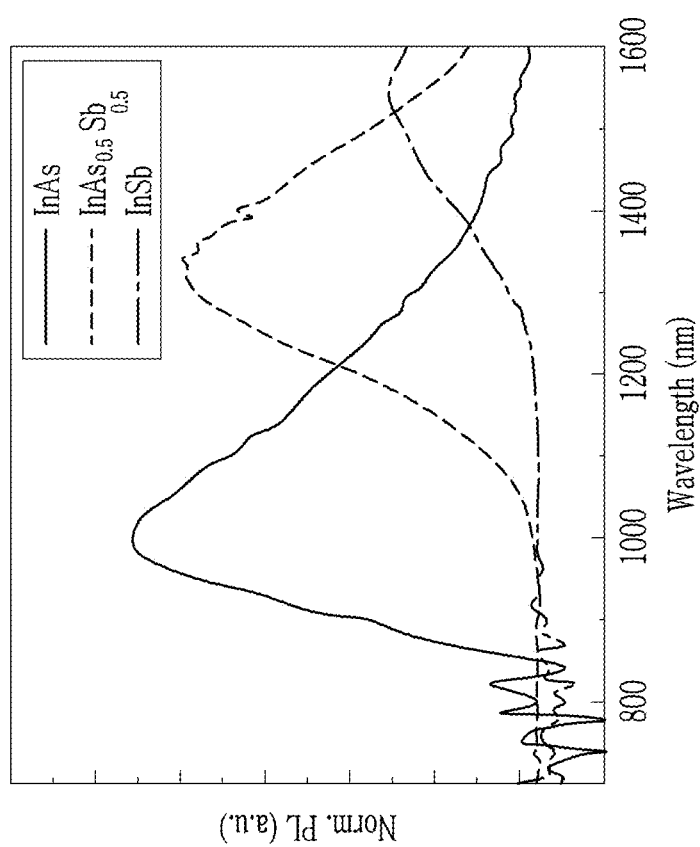
FIG. 13 is a photoluminescent spectrum of the quantum dots prepared in Example 4A.

The PL spectra and the absorption spectra of some of the QDs prepared are shown in FIG. 12 and FIG. 13, which show single peaks, indicating no secondary phase. As the Sb content increases, the PL peak red shifts, which is consistent with the trend of narrower band gaps observed in other measurements.

Example 4B: Preparation of a FET Device

The chemical composition of the alloy may also affect the electronic band structure and doping of the material, leading to different majority carrier type and concentration. Using a Na$_2$S solid-state ligand exchange, field-effect transistor (FET) devices of these QDs having a similar structure to the one shown in FIG. 1A are prepared. Without wishing to be bound by any theory, given the similar electron and hole mobility measured in these alloy QD solids, the change of current is mainly attributed to the change in carrier concentration.

The current-voltage (I-V) characterization of the device shows higher hole currents and positively shifted threshold voltages as the Sb molar ratio increases, indicating more holes are introduced by the incorporation of Sb. Sulfur may be a donor for the bulk Group IIIA-VA compound material. The doping effect from Na$_2$S may appear after the device is annealed at 200° C. and the FET device may show higher electron currents.

The hole mobility measured from as fabricated InAs0.5Sb0.5 QD FETs is ~$10^{-5}$ square centimeters per volt-second (cm$^2$/Vs), but the hole mobility may further increase to ~$10^{-4}$ cm$^2$/Vs after 200° C. annealing, which may be suitable for carrier transport as the active material in photodiode structures. FIG. 1B is a schematic view of a device of an embodiment and FIG. 1C is a schematic cross-sectional view of a device of an embodiment.

Example 4C: Preparation of a Heterojunction Photodiode Device

InSb QD heterojunction photodiodes with the structure shown in FIG. 1D are prepared. The 25-nm ZnO layer is made on indium tin oxide (ITO)/glass substrates using a sol-gel method. InSb QD layers are fabricated by repeatedly (×8) depositing QDs (15 milligrams per milliliter (mg/mL)) with a solid-state ligand exchange agent of Na$_2$S. Then, 12 nm of MoO$_3$ and 65 nm of Au are thermally evaporated on top of the InSb QD layer to form the hole transporting layer and top contact, respectively.

Figure 14:
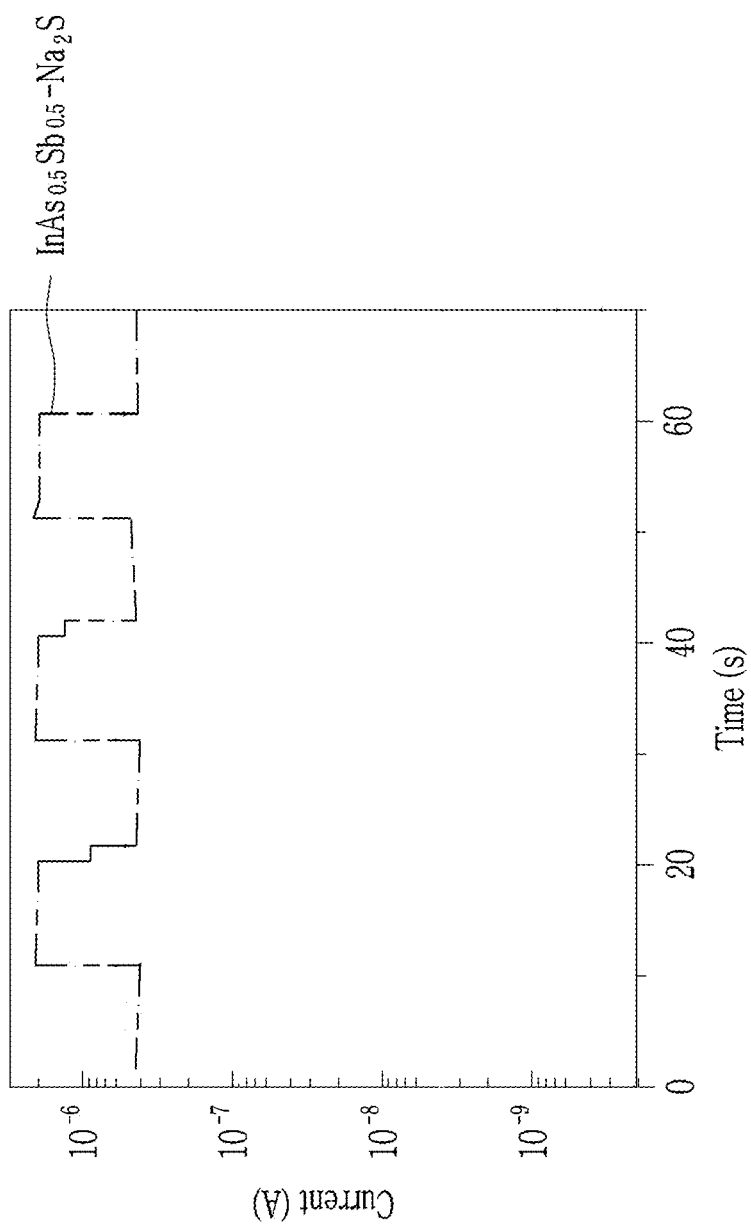
FIG. 14 is a view showing a photoresponse property of the device prepared in Example 4C.

The photoresponse of these diodes to 1.55 μm illumination operated at 0 volt (V) bias is measured and the results are shown in FIG. 14. The results confirm that a relatively high photocurrent photoresponse is observed for a device with InAs$_{0.5}$Sb$_{0.5}$ QDs treated by Na$_2$S (the on/off ratio is about 4.4)

Example 5: Production and Characteristic Analysis of InAs QD Field Effect Transistors (FETs)

InAs quantum dots are made by the method described by the Example 1 except for using AsCl$_3$-oleylamine solution is used as the group V precursor. FETs are prepared having a structure shown in FIG. 1a to make a research on the effects of ligand exchange of the InAs QDs.

For the solid-state ligand exchange of the surface of the InAs QD film, a solution of Na$_2$S in methanol is applied on spin-cast InAs QD thin film. Three times of wash of the QD film is performed with pristine methanol. For the solution phase ligand exchange of the InAs QD surface, Na$_2$S is dissolved in formamide to be in contact with the QD dispersion in toluene. After agitating the mixture of the two solutions, QDs are transferred into the formamide phase capped by S$^{2-}$ when the ligand exchange is complete. Pristine toluene and acetonitrile are used to purify the QD dispersion and ensure them to be dispersed in n,n-dimethylformamide. For a solution- and solid-state hybrid ligand exchange process, the InAs QD dispersion is firstly exchanged the ligand with Na$_2$S in the solution phase as described above, and spin-cast into a semiconductor thin film on the substrate, and then treated by the NaN$_3$ solution in methanol in the solid-state.

To fabricate FET devices, doped Si substrates that have a SiO$_2$ gate oxide having a predetermined thickness is prepared. A semiconductor film is formed by performing solid-state, solution or hybrid ligand exchange of InAs QDs on the Si substrate. In and Au contacts are vapor-deposited sequentially as a source electrode and a drain electrode.

Fabrication of the device is carried out under a dry nitrogen atmosphere and the deposited nanocrystal film is dried at a predetermined temperature for a solvent removal.

Figure 15:
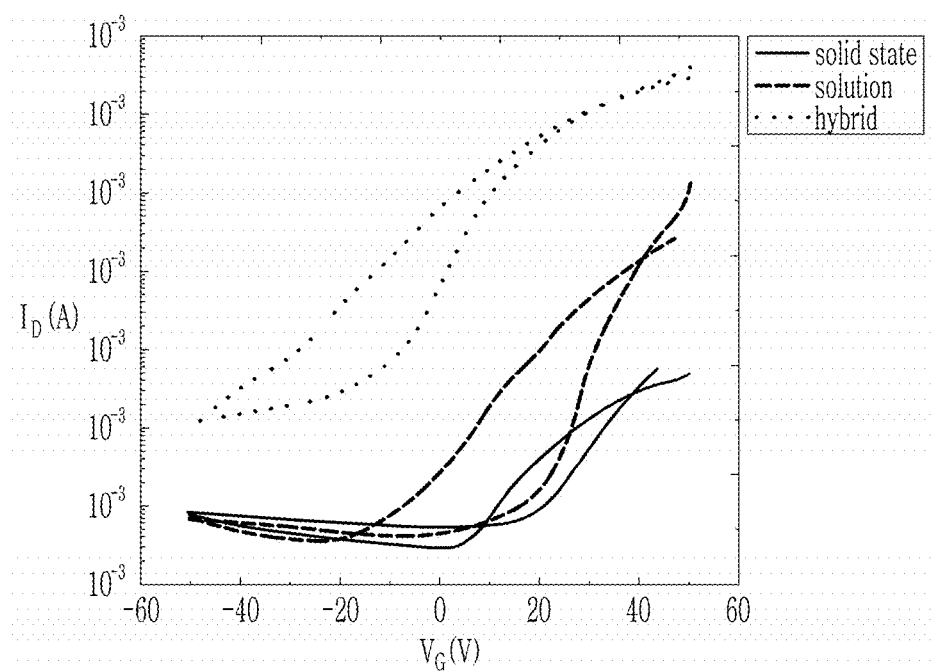
FIG. 15 is a graph of source-drain current ($I_{DS}$ (A)) versus gate voltage ($V_G$ (V)) showing the results of the electrical property analysis of devices (semiconductor layers) prepared by different ligand exchange approaches in Example 5.

Electrical properties of the fabricated devices are measured and the results are shown in FIG. 15. FIG. 15 shows the source-drain current versus gate voltage ($I_{DS}$-$V_G$) characteristics of the devices. Referring to FIG. 15, in comparison with the device prepared by the solid-state ligand exchange, the device fabricated with solution and hybrid ligand exchange may exhibit an $I_{DS}$($V_G$=50 V) increase by about 100 and 10,000 times, respectively.

From the $I_{DS}$-$V_G$ curves, the electron mobility (square centimeters per volt-second (cm$^2$/Vs)) is calculated and the results are shown in Table 2:

TABLE 2

| | |
|---|---|
| Na$_2$S solid-state ligand exchange | 3.2 × $10^{-3}$ cm$^2$/Vs |
| Na$_2$S solution ligand exchange | 0.25 cm$^2$/Vs |
| Na$_2$S solution and NaN$_3$ solid-state hybrid ligand exchange | 5.5 cm$^2$/Vs |

In comparison with the device prepared by the solid-state ligand exchange, the device includes a solution ligand exchange may achieve an increase in electron mobility of 78 times. In comparison with the device prepared by the solid-state ligand exchange, the device fabricated by the hybrid ligand exchange may achieve an increase in electron mobility of 1700 times.

The hybrid ligand exchange process does not involve explosive and corrosive solvents, such as hydrazine. All of the ligand compounds are commercially available.

Without wishing to be bound by any theory, it is believed that the enhanced electrical characteristics are possibly due to reduced interparticle distance after the ligand exchange and improved doping by the sulfur enrichment.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A production method of a quantum dot comprising a Group IIIA-VA compound, which comprises:
   supplying a Group VA element precursor comprising a halide of a Group VA element and a first ligand comprising a phosphine compound or a first amine compound; and
   performing a reaction between the Group VA element precursor and a Group IIIA metal precursor in the presence of a reducing agent in an organic reaction medium comprising a second amine compound.

2. The method of claim 1, wherein the halide of the Group VA element comprises a chloride, a bromide, an iodide, or a combination thereof.

3. The method of claim 1, wherein the halide of the Group VA element comprises $PCl_3$, $SbCl_3$, $AsCl_3$, $BiCl_3$, $PBr_3$, $SbBr_3$, $AsBr_3$, $BiBr_3$, $PI_3$, $SbI_3$, $AsI_3$, $BiI_3$, or a combination thereof.

4. The method of claim 1, wherein the phosphine compound comprises a C1 to C40 aliphatic hydrocarbon, a C6 to C40 aromatic hydrocarbon, or a combination thereof, which is linked to a phosphorous atom.

5. The method of claim 1, wherein the phosphine compound comprises $R_3PO$, $R_2HPO$, $RH_2PO$, $R_3P$, $R_2PH$, $RPH_2$, $RPO(OH)_2$, $RHPOOH$, $RHPOOH$, $R_2POOH$, or a combination thereof, wherein each R is independently a substituted or unsubstituted C5 to C40 aliphatic hydrocarbon, a substituted or unsubstituted C6 to C40 aromatic hydrocarbon, or a combination thereof.

6. The method of claim 1, wherein the first amine compound and the second amine compound are the same or different and the first amine compound, the second amine compound, or a combination thereof comprises a C1 to C40 aliphatic hydrocarbon, a C6 to C40 aromatic hydrocarbon, or a combination thereof.

7. The method of claim 1, wherein the first amine compound, the second amine compound, or a combination thereof comprises $RNH_2$, $R_2NH$, or a combination thereof, wherein each R is independently a substituted or unsubstituted C5 to C40 aliphatic hydrocarbon, a substituted or unsubstituted C6 to C40 aromatic hydrocarbon, or a combination thereof.

8. The method of claim 1, wherein each of the first amine compound and the second amine compound does not comprise a tertiary amine.

9. The method of claim 1, further comprising preparing the Group VA element precursor by dissolving the halide of the Group VA element in the first ligand optionally at a temperature of greater than or equal to about 30° C. to prepare a solution.

10. The method of claim 1, further comprising preparing the Group VA element precursor by adding a non-solvent to the prepared solution to obtain a solid compound comprising the Group VA element precursor.

11. The method of claim 1, wherein the Group VA element precursor has a form of a transparent liquid at a temperature of greater than or equal to about 60° C.

12. The method of claim 1, wherein the Group VA element precursor is a solid at room temperature.

13. The method of claim 1, wherein the Group IIIA metal precursor comprises
indium, gallium, aluminum, or a combination thereof; and
an amine group, a halide moiety, or a combination thereof.

14. The method of claim 1, wherein the Group IIIA metal precursor comprises indium chloride, indium iodide, indium bromide, gallium chloride, gallium iodide, gallium bromide, aluminum chloride, aluminum iodide, aluminum bromide, or a combination thereof.

15. The method of claim 1, wherein the method further comprises dissolving the IIIA metal precursor in the second amine compound to obtain a solution, and degassing the solution at a temperature of at least about 100° C. prior to conducting the reaction.

16. The method of claim 1, wherein the reducing agent comprises a hydride reducing agent.

17. The method of claim 1, wherein the reaction is carried out at a temperature of greater than or equal to about 200° C.

18. The method of claim 1, wherein the reaction is performed in the absence of a phosphine compound.

* * * * *